United States Patent
Sogard

Patent Number: 5,866,935
Date of Patent: Feb. 2, 1999

[54] TUNNELING DEVICE

[75] Inventor: Michael R. Sogard, Menlo Park, Calif.

[73] Assignee: Nikon Precision, Inc., Belmont, Calif.

[21] Appl. No.: 756,295

[22] Filed: Nov. 25, 1996

Related U.S. Application Data

[62] Division of Ser. No. 209,026, Mar. 9, 1994, Pat. No. 5,631,731.

[51] Int. Cl.⁶ .............................................. H01L 31/0232
[52] U.S. Cl. ........................ 257/435; 257/457; 257/459; 257/464
[58] Field of Search .................... 257/457, 459, 257/464, 431, 435

[56] References Cited

U.S. PATENT DOCUMENTS

| | | | |
|---|---|---|---|
| Re. 32,795 | 12/1988 | Matsuura et al. | 356/121 |
| 3,938,894 | 2/1976 | Nanba | 356/123 |
| 4,357,100 | 11/1982 | Mayer et al. | 355/62 |
| 4,443,096 | 4/1984 | Johannsmeier et al. | 355/53 |
| 4,456,368 | 6/1984 | Isaka et al. | 399/336 |
| 4,498,767 | 2/1985 | McGovern et al. | 356/121 |
| 4,540,277 | 9/1985 | Mayer et al. | 355/53 |
| 4,585,342 | 4/1986 | Lin et al. | 356/124 |
| 4,660,981 | 4/1987 | Stridsberg | 356/375 |
| 4,662,747 | 5/1987 | Isaacson et al. | 356/317 |
| 4,684,206 | 8/1987 | Bednorz et al. | 385/129 |
| 4,725,727 | 2/1988 | Harder et al. | 374/122 |
| 4,917,462 | 4/1990 | Lewis et al. | 359/368 |
| 4,929,083 | 5/1990 | Brunner | 356/400 |
| 5,001,737 | 3/1991 | Lewis et al. | 378/147 |
| 5,105,737 | 4/1992 | Betzig et al. | 250/227.14 |
| 5,123,734 | 6/1992 | Spence et al. | 356/121 |

FOREIGN PATENT DOCUMENTS 2-147925  6/1990  Japan.

OTHER PUBLICATIONS

Mayer, Herbert E., Loebach, Ernst W., "A New Step-By-Step Aligner for Very Large Scale Intergration (VLSI) Production," *Semiconductor Microlithography V*, vol. 221 (1980), pp. 9–18.

*Primary Examiner*—Minh-Loan Tran
*Attorney, Agent, or Firm*—Townsend and Townsend and Crew LLP

[57] ABSTRACT

A method and apparatus to analyze the aerial image of an optical system using a subwavelength slit. A slit configuration yields a higher signal-to-noise ratio than that achievable with a round aperture. The slit also allows the polarization of the aerial image to be analyzed. In an alternative embodiment a tunneling slit is used. The tunneling slit comprises an optically transparent ridge-like structure mounted to a substrate, the combined structure covered by a thin, planar metal film.

7 Claims, 22 Drawing Sheets

TUNNELING DEVICE

This is a Division of application No. 08/209,026, filed Mar. 9, 1994, now U.S. Pat. No. 5,631,731.

BACKGROUND OF THE INVENTION

The present invention relates generally to self metrology of optical projection lithography systems, and more specifically, to a method and apparatus for analyzing the aerial image of such a system using a subwavelength slit.

As the feature sizes on integrated circuit devices have grown ever smaller, the demands on the optical train in the optical lithography system have grown ever greater. This has led to an increased need for techniques for accurate and real-time monitoring of the optical system's performance.

In a typical prior art technique for monitoring system performance, a reticle pattern is imaged onto a resist coated substrate. The substrate is then developed and used to analyze the optical system's performance. The analysis is based on the pattern being a convolution of a perfect image of the reticle and the performance characteristics of the stepper's optical system. Unfortunately, the nonlinear qualities of the photoresist technique adds a third variable making it difficult to accurately reduce the data and derive the performance of the optical system. A further problem with this method of analysis is that it is slow and time consuming.

SUMMARY OF THE INVENTION

The invention provides a method and apparatus for analyzing the aerial image of an optical system using a subwavelength slit (a slit narrower than the wavelength of the light illuminating it) or its functional equivalent. The aerial image refers to the intensity distribution of an image in or near the image focal plane of an optical system. Analysis of this image, especially in systems operating near the diffraction limits of the optical system, provides valuable real-time information on the performance of the optical system.

A slit is used instead of a round aperture in order to increase the amount of energy transmitted beyond the slit. Subwavelength round apertures in metal films of finite thickness transmit essentially only evanescent light. Evanescent light refers to electromagnetic fields produced in the immediate vicinity of the aperture edges. These fields don't propagate like normal electromagnetic waves and therefore cannot be detected remotely. However, if a dielectric medium is present, some fraction of the evanescent light is converted to propagating waves which can be detected. Although a slit also produces evanescent light, for incident light with the magnetic vector parallel to the slit edge a propagating mode always exists, which produces a substantial increase in the slit's transmission.

In the preferred embodiment, a slit plate is included on the wafer holder stage of an optical projection lithography system. In order to examine the aerial image of the optical system prior to exposing the wafer, the stage is repositioned such that the slit plate will lie proximate to the image plane of the optical system. After replacing the reticle with a special test pattern, the slit is scanned across the image plane while the transmission of the slit is monitored. This provides the user with a high resolution intensity profile of the generated image. In the preferred embodiment, a fluorescent material mounted in the near field of the slit converts transmitted light, including evanescent light, to longer wavelengths which are subsequently detected by a photodetector. From the intensity profile of the aerial image, errors in the optical system can be determined. Thus this system offers a real time, high fidelity method of monitoring the performance of the optical system.

The aerial image most readily analyzed by the slit is a line image, oriented parallel to the slit long axis, and longer than the slit length. The slit plate preferably includes slits with several orientations, so that line patterns with different orientations can be analyzed. The slits and their corresponding patterns are positioned so that only the slit, or slits, of a given orientation are illuminated at a given time.

In an alternative embodiment, a tunneling slit is used instead of the subwavelength slit. The tunneling slit, a functional equivalent to the subwavelength slit, has no actual slit or interruption in its surface. It is designed and fabricated to have transmission characteristics similar to those of a subwavelength slit. The tunneling slit is potentially easier to fabricate then the subwavelength slit and yet provides comparable performance.

In an alternative embodiment, the aerial image consisting of a parallel series of images is analyzed using a series of parallel slits with the same spacing as the image periodicity. In this embodiment the slits can either be subwavelength slits or tunneling slits. Due to the multiple slit arrangement, the intensity is increased as is the signal-to-noise ratio.

Studies show a 150 nm wide slit of molybdenum (Mo) or silicon (Si) with vertical walls and thickness of about 120 nm can represent close to an ideal aerial image monitor. This slit reproduces the width of the aerial image to within about 5% for both transverse electric mode (TEM) and transverse magnetic mode (TMM) polarization states. Furthermore the transmissions for TEM and TMM agree to within about 5%. The image contrast determined by the slit is in good agreement with that of the aerial image. From signal to noise considerations it should be possible to measure an image in less than 1 sec using a single slit 10 μm long.

A subwavelength slit for use with the present invention may be fabricated with vertical sidewalls (sometimes referred to as a standard slit) or sloping sidewalls (sometimes referred to as a vee slit). Vertical walled slits can be fabricated using electron-beam lithography. However, vee-shaped slits and tunneling slits can be fabricated from silicon (Si) using optical lithographic techniques.

Reference to the remaining portions of the specification and the drawings will provide further understanding of the nature and advantages of the invention.

DESCRIPTION OF SPECIFIC EMBODIMENTS

System Overview

Figure 1A:
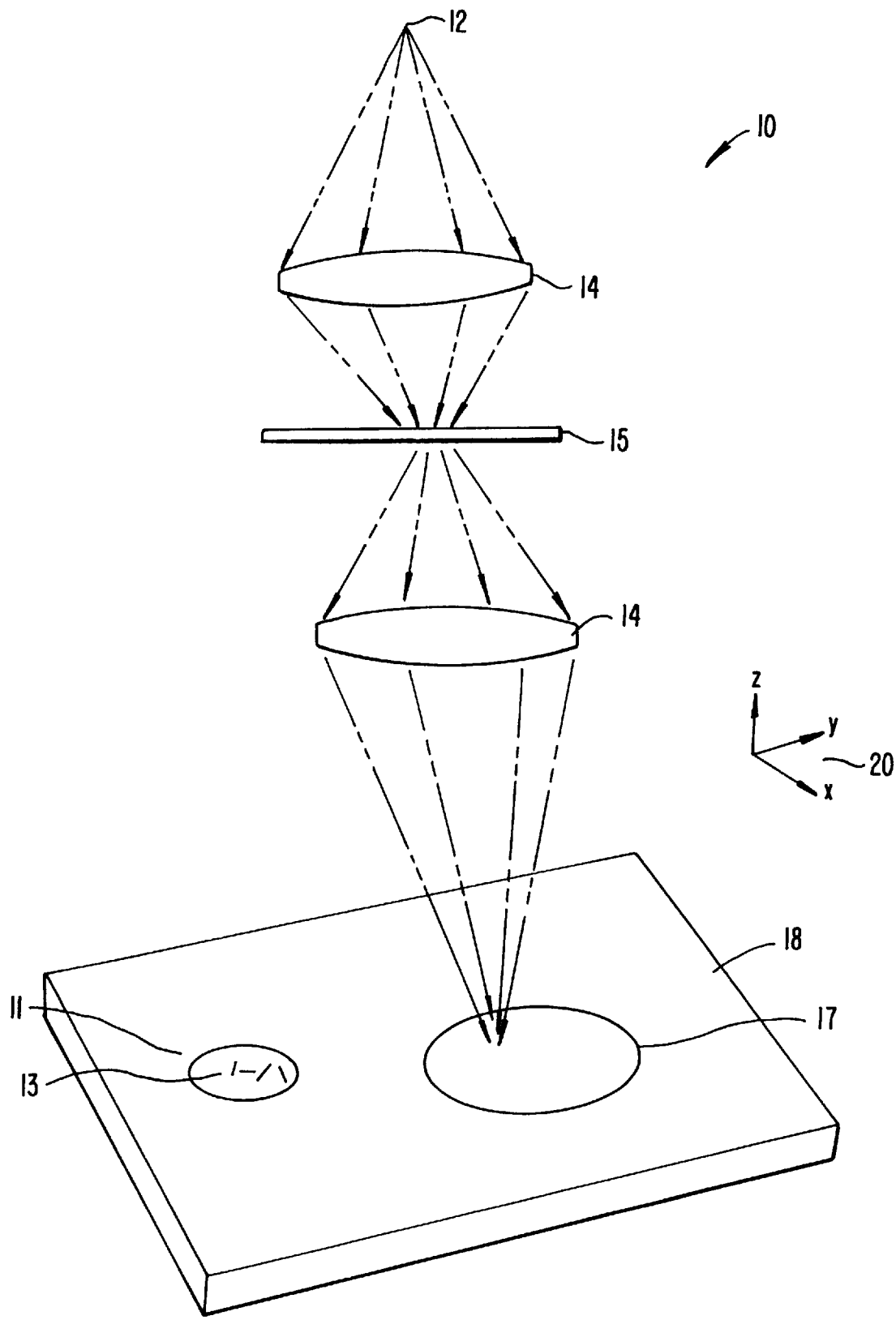
FIG. 1A shows an optical projection lithography stepper system utilizing the aerial image analyzer of the present invention.

FIG. 1A shows an optical stepper lithography system 10. In a typical chip processing configuration, a light source 12 and optics 14 image a reticle 15 onto a wafer 17. Wafer 17 is mounted to an x-y-z positioning stage 18. Stage 18 allows step and repeat patterns to be applied to wafer 17. Also mounted to stage 18 is a slit plate 11 which, in this embodiment, contains several slits 13, each oriented in a different direction. A rectilinear coordinate system 20 is denoted schematically.

Figure 1B:
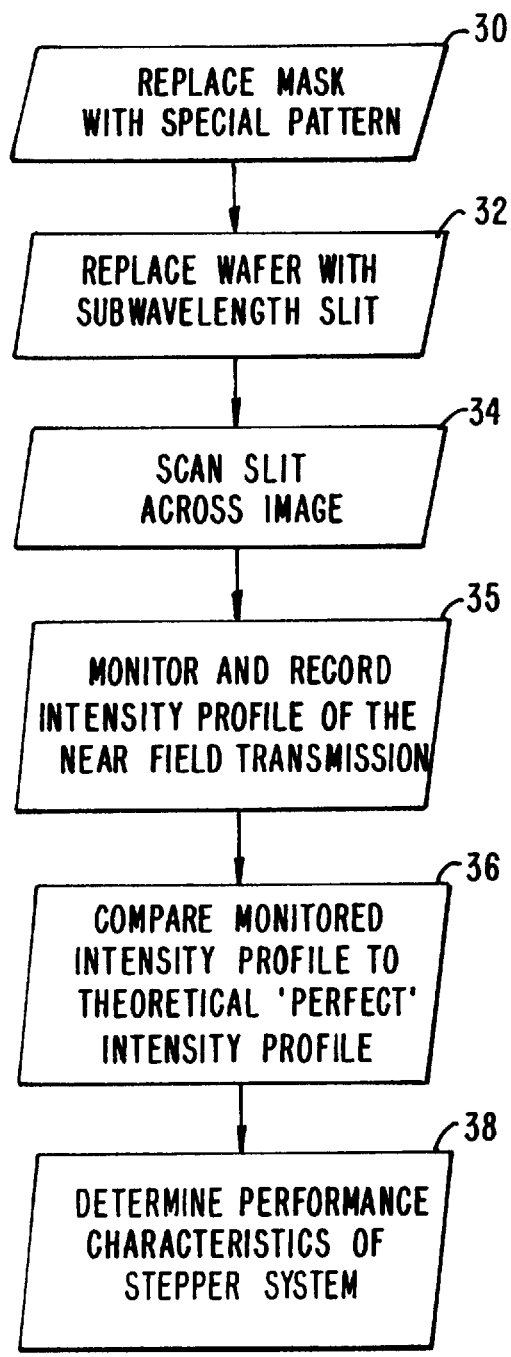
FIG. 1B shows the use of one embodiment of the present invention as a means of measuring the optical performance of the stepper.

FIG. 1B shows the use of one embodiment of the present invention as a means of measuring the optical performance of modified stepper 10. As in the prior art technique, reticle 15 is replaced with a special test pattern (step 30). Stage 18 is translated until wafer 17 is replaced with subwavelength slit 13 or its functional equivalent (step 32). In this position the slit is lying in, or within a few wavelengths of, the image plane. The slit is then moved or scanned across the image plane, the long axis of the slit being held perpendicular to the scan direction (step 34). During the scanning operation, the intensity of the slit's transmission is monitored and recorded (step 35). The measured intensity profile is compared to a previously calculated profile expected from a "perfect" stepper (step 36). From this comparison the performance characteristics of the optical system are determined (step 38).

Figure 2:
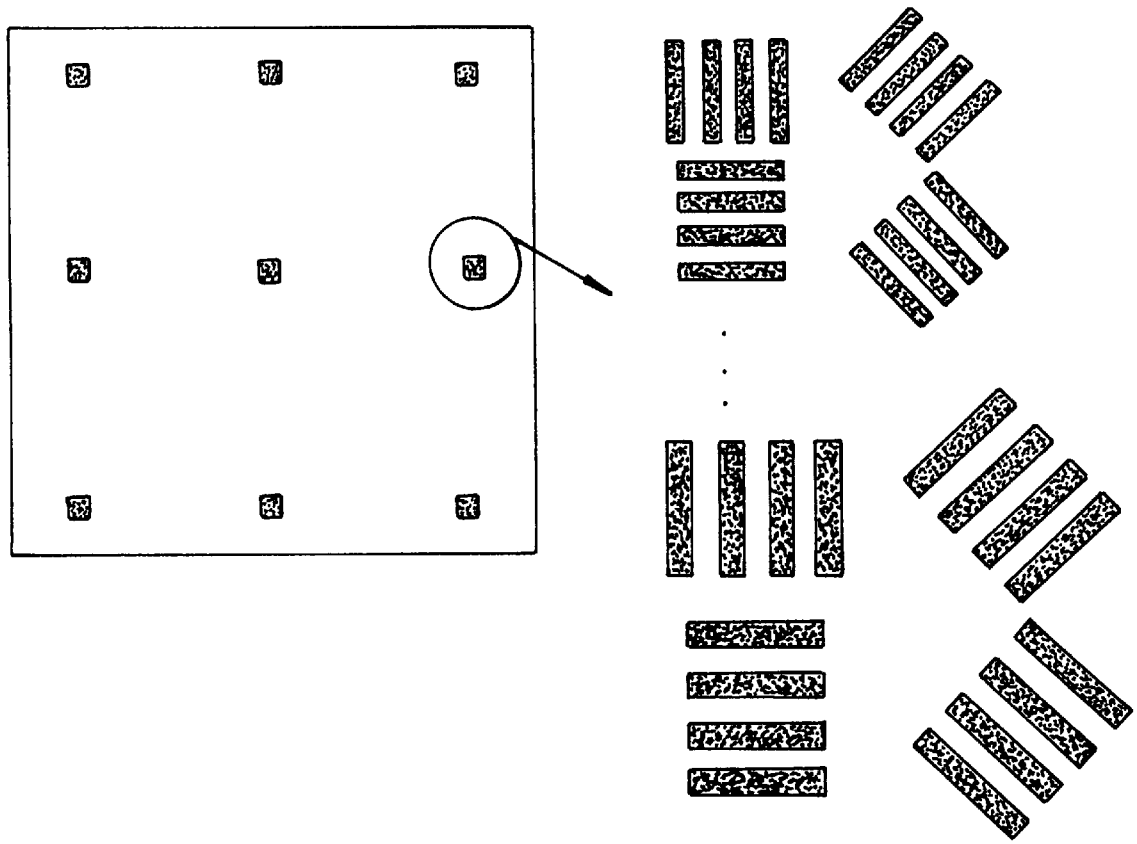
FIG. 2 shows one example of a special test pattern.

FIG. 2 shows one example of a test pattern. Several sets of line patterns, at different orientations to the stepper's x-y coordinate system, are positioned in different regions of the image field of the stepper optics. Such a pattern should allow the image quality to be well characterized over the entire image field and allow the separate determination of a number of basic lens aberrations, such as spherical aberration, coma, and astigmatism. Additional sets of line patterns of different line width can provide additional information, which can be used to optimize exposure conditions. The present invention therefore offers the advantage of being able to perform real time, high fidelity analysis of the performance of the optical system.

Figure 3A:
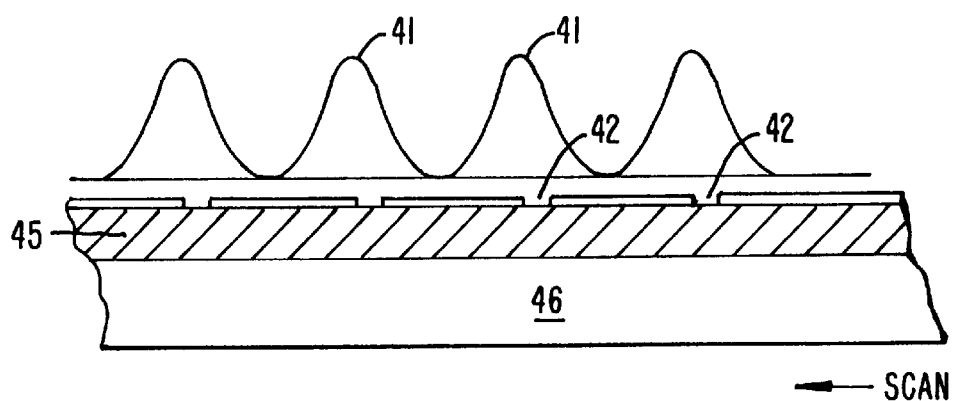
FIG. 3A shows the simultaneous examination of several parallel line images.
Figure 3B:
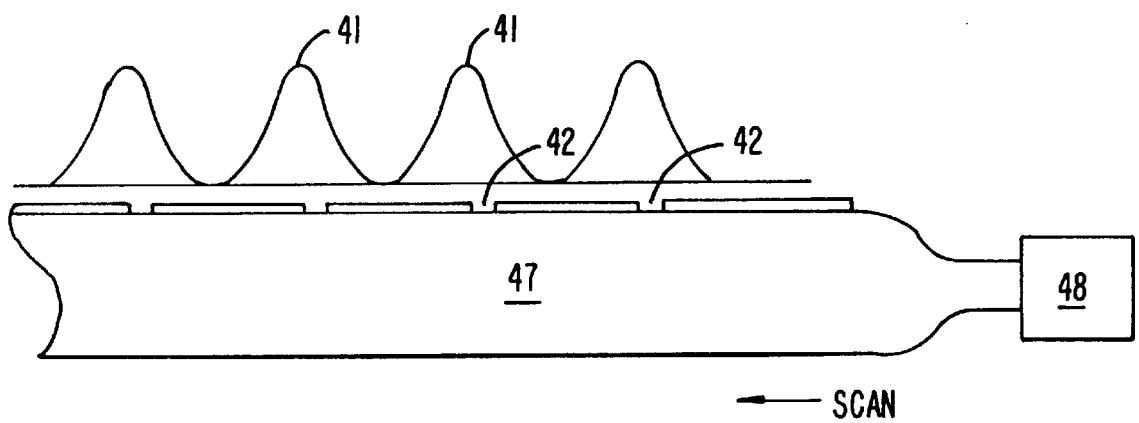
FIG. 3B shows an alternative embodiment utilizing a light pipe and a photomultiplier.

FIG. 3A shows the simultaneous examination of several parallel aerial line images 41. Instead of a single slit being used, multiple slits 42 are used, thereby increasing the signal level. The period of the slits should be either equal to or a multiple of the period of the aerial image to be analyzed in order to achieve the desired higher signal levels. The long axes of all of the slits 42 are held perpendicular to the scan direction. In this embodiment, a fluorescent material 45 is mounted within the near field of slits 42. Material 45 converts the light to longer wavelengths where it is detected by a photodetector 46. The use of fluorescence has the advantage that it is easier to detect light in the longer wavelengths. FIG. 3B shows an alternative embodiment in which fluorescent material 45 and detector 46 are replaced with a light pipe 47 which transmits the photons to a photomultiplier 48.

Slit Characteristics

Figure 4:
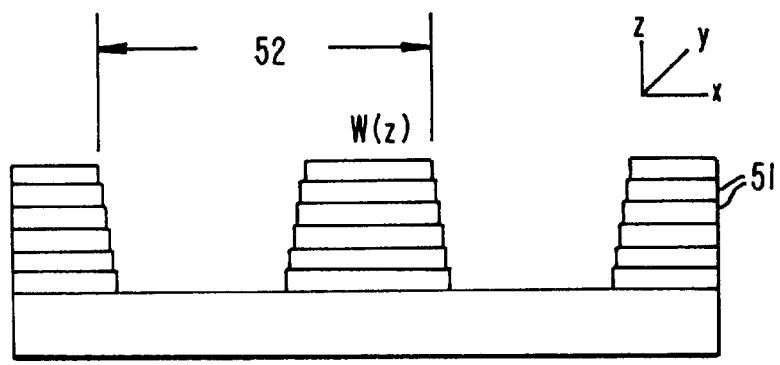
FIG. 4 shows the analytical waveguide model.

FIG. 4 shows an example of the analytic waveguide model used to analyze the behavior of various slit designs. The slit is treated like a waveguide in the z direction (normal to the plane of the film). If the slit dimensions vary with z, several waveguide sections or 'slabs' 51, one above the other and of varying sizes to match the z dependence, are used.

For each slab 51 the eigenfunctions are calculated. Polarization effects and evanescent light are included. For an incident plane wave, boundary conditions at the interfaces between the slabs, the substrate, and the air are matched to obtain eigenvalues for all slab eigenfunctions. For conducting slabs the eigenvalues are complex. Next the S-matrix which couples the incident plane wave to the transmitted wave is calculated. The S-matrix completely defines the transmission properties of the slit structure. For an aerial image, the image is Fourier transformed into plane wave components. Then the S-matrix is applied to transmit these components through the slit where they are recombined to give the transmitted amplitude and intensity. Because the above analysis uses a grating equation formalism in its calculations, a set or array of slits is assumed in all calculations. A repeat distance 52 of 2 $\mu$m is used.

Figure 5:
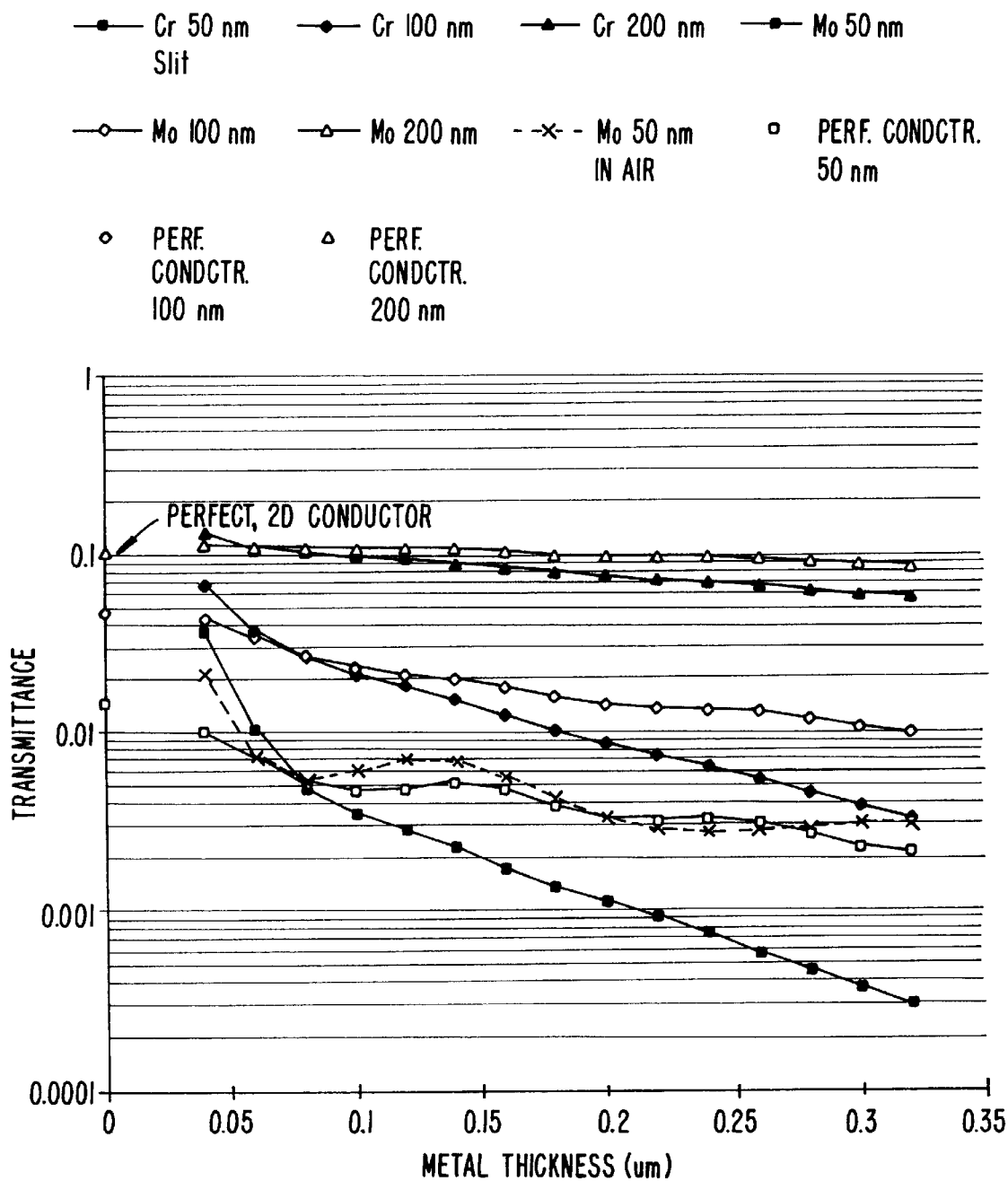
FIG. 5 shows a series of plots of transmission versus film thickness for slits in which the slit walls are parallel and vertical.

FIG. 5 shows a series of plots of transmission versus film thickness for slits in which the slit walls are parallel and vertical. The definition of transmission here requires some explanation. Normally transmission would be defined as the fraction of light incident on the slit which is transmitted. The transmitted power/unit length is then proportional to the slit width and the transmission coefficient. However, transmission is defined here as the fraction of light incident over one repeat distance which is transmitted, to allow the effects of the partial transparency of very thin films to be included.

In the preferred embodiment, the slit is fabricated using standard micro-circuit processing techniques which are well known in the art. The slit film sits on top of a dielectric substrate representing the fluorescent converter which, in the preferred embodiment, is made of $CaF_2$. The index of refraction is taken as 1.468. The presence of the substrate has some effect on the transmission. Slit films of both chrome (Cr) and Mo are analyzed for slit widths of 50, 100, and 200 nm, each. Mo and Si have almost identical optical constants and therefore can be expected to perform similarly.

Slits fabricated from Si, however, should be much easier to make than those of Mo.

As shown in FIG. 5, in most cases for small metal film thickness the transmission through the slits in the real metal films exceeds that for the perfectly conducting case. This is because of the tunneling of light through the film which is significant for thin films. The effect is less for the Mo films, because the extinction factor of Mo is about twice that of Cr.

Figure 6A:
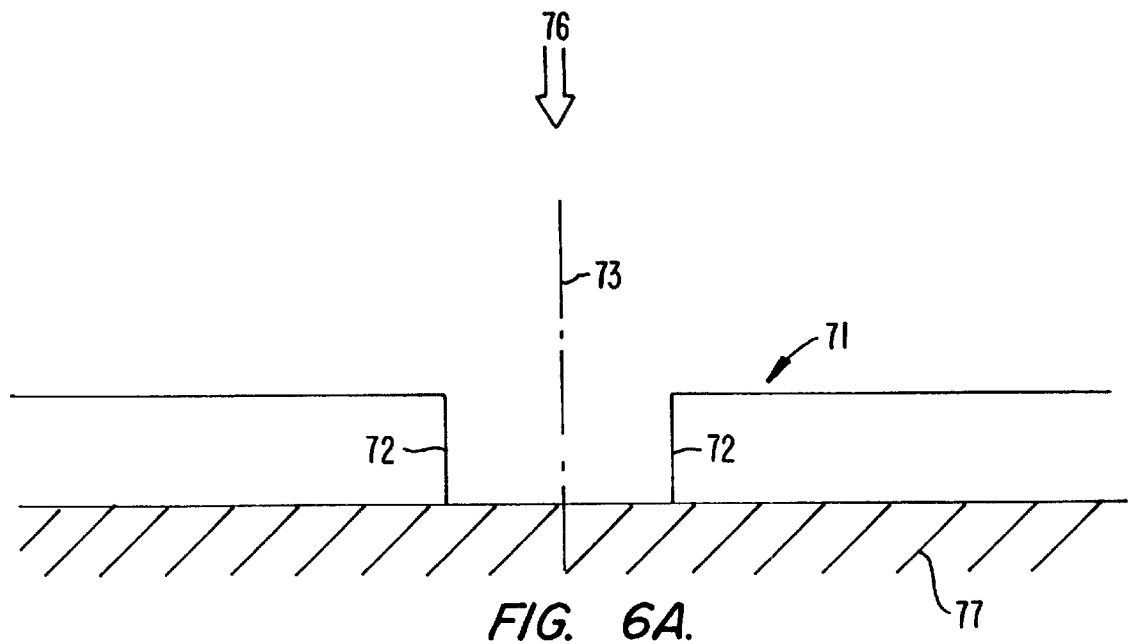
FIGS. 6A–6C show other slit geometries.
Figure 6B:
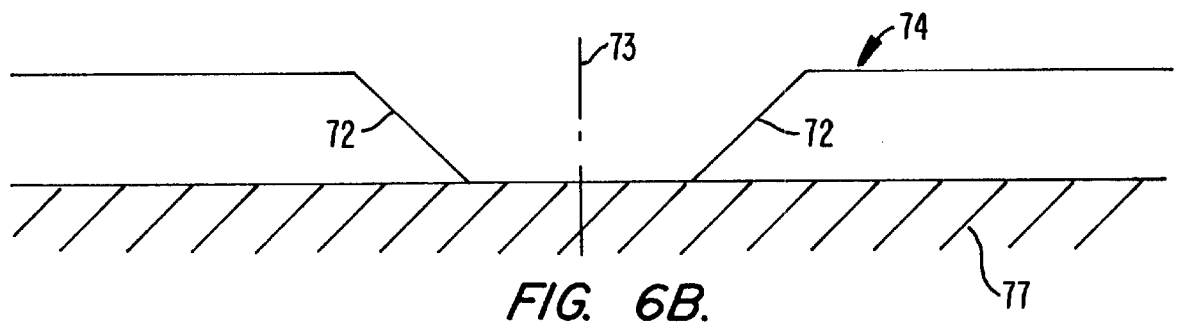
Figure 6C:
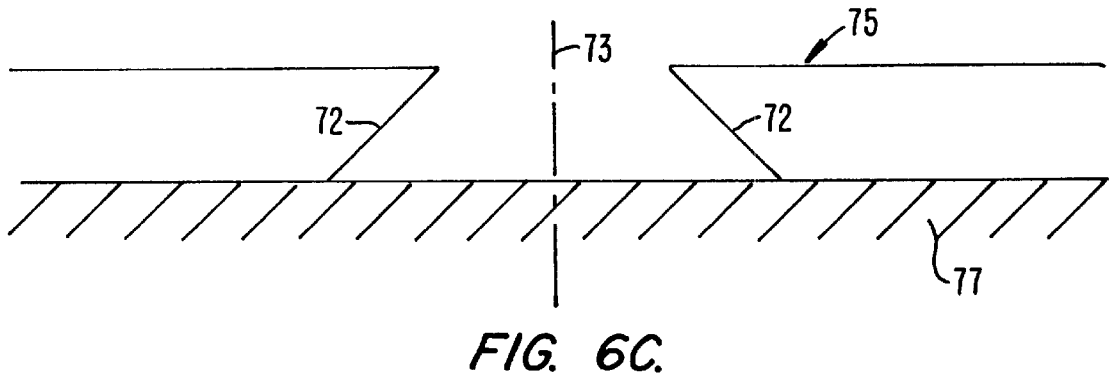

FIGS. 6A–C show other slit geometries. A slit 71 is a 'standard' slit in which the slit walls 72 are vertical and parallel to the optic axis 73. A slit 74 has a 'vee' geometry while slit 75 has an 'inverted vee' geometry. The angles between the slit walls and optic axis 73 for both slits 74 and 75 are 45 degrees, but other angles (say 30–60 degrees) can be used. Arrow 76 indicates the direction of the light incident on the slits. A material 77 indicates the slit substrates. Creating either the vee slit 74 or the inverted vee slit 75 in metal would probably be difficult, but they can be made in a straightforward way using single crystal Si in the <100> orientation, and anisotropic etching. However, the angle between the slit wall and the optic axis would then be 35.26°. These structures are modeled by approximating the sloping edges by a series of rectangles/slabs whose horizontal dimensions change in a regular manner.

Figure 7:
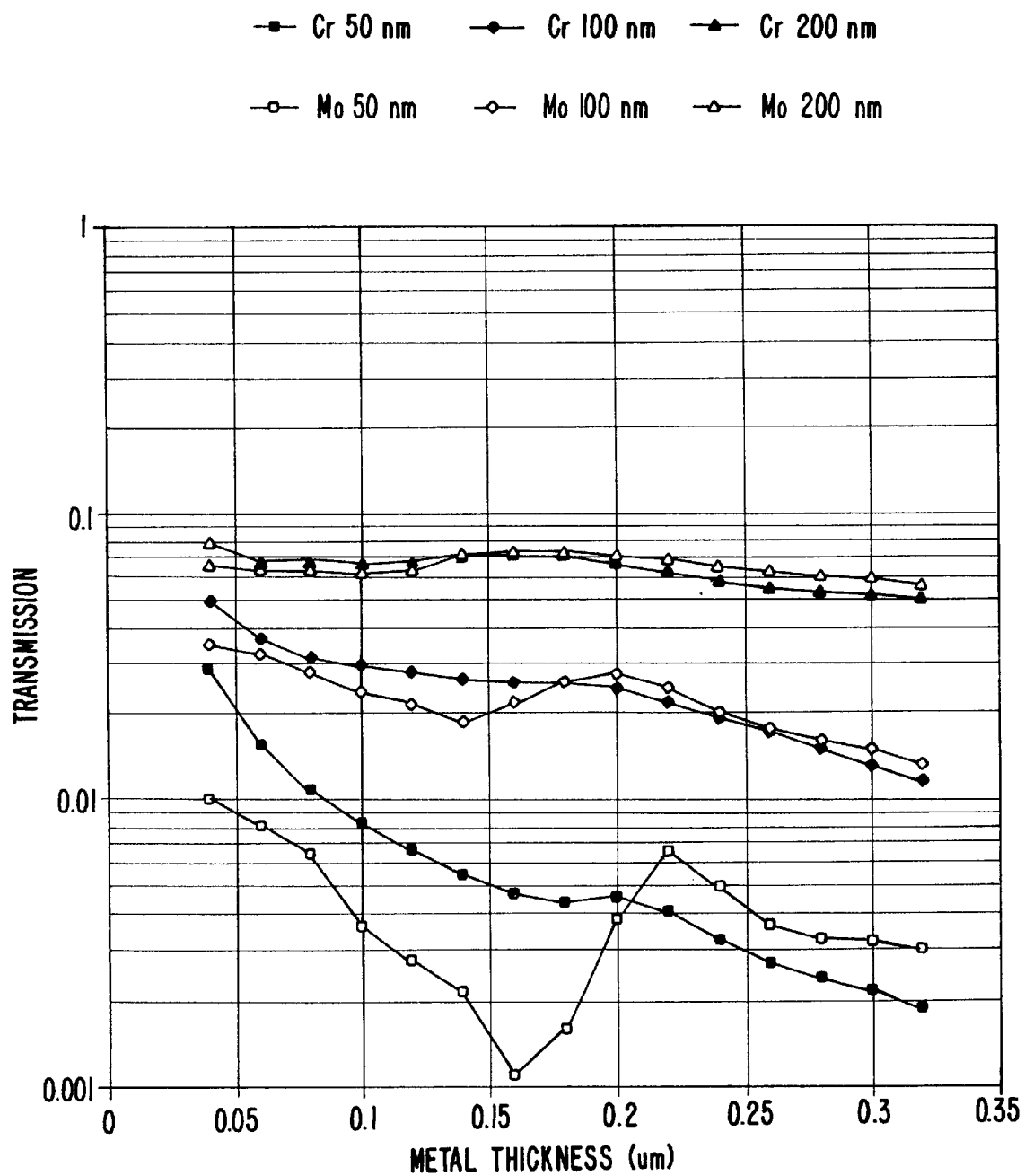
FIG. 7 shows a series of plots of transmission versus film thickness for vee geometry slits with 50, 100, and 200 nm slit widths.

FIG. 7 shows a series of plots of transmission versus film thickness for vee geometry slits with 50, 100, and 200 nm slit widths. The transmission dependence on metal thickness is more complicated than the case with vertical walls. Also there is less decrease in transmission with increasing metal thickness than for the vertical wall case. To some extent the higher transmission is probably due to the thinner walls near the vee, so that this slit behaves like a vertical wall slit with a larger opening. There may be a collection horn effect as well, with the sloping walls allowing a better impedance match between free space and the interior of the slit.

Figure 8:
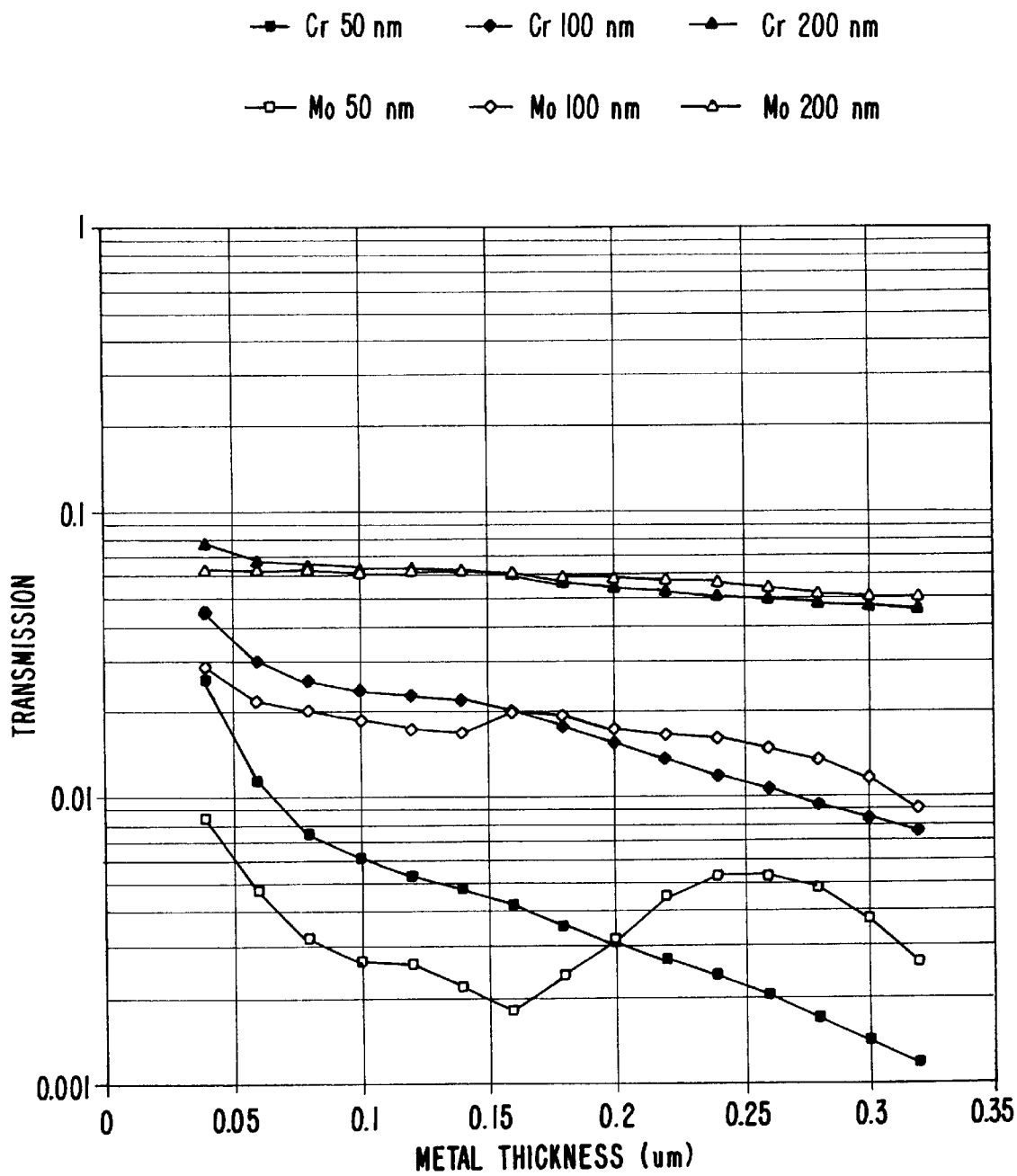
FIG. 8 shows a series of plots of transmission versus film thickness for inverted vee geometry slits with 50, 100, and 200 nm slit widths.

FIG. 8 shows a series of plots of transmission versus film thickness for inverted vee geometry slits with 50, 100, and 200 nm slit widths. Like the vee geometry there is less decrease with increasing metal thickness than for the vertical wall case. However the variations in transmission with metal thickness are smaller than the vee case.

Figure 9:
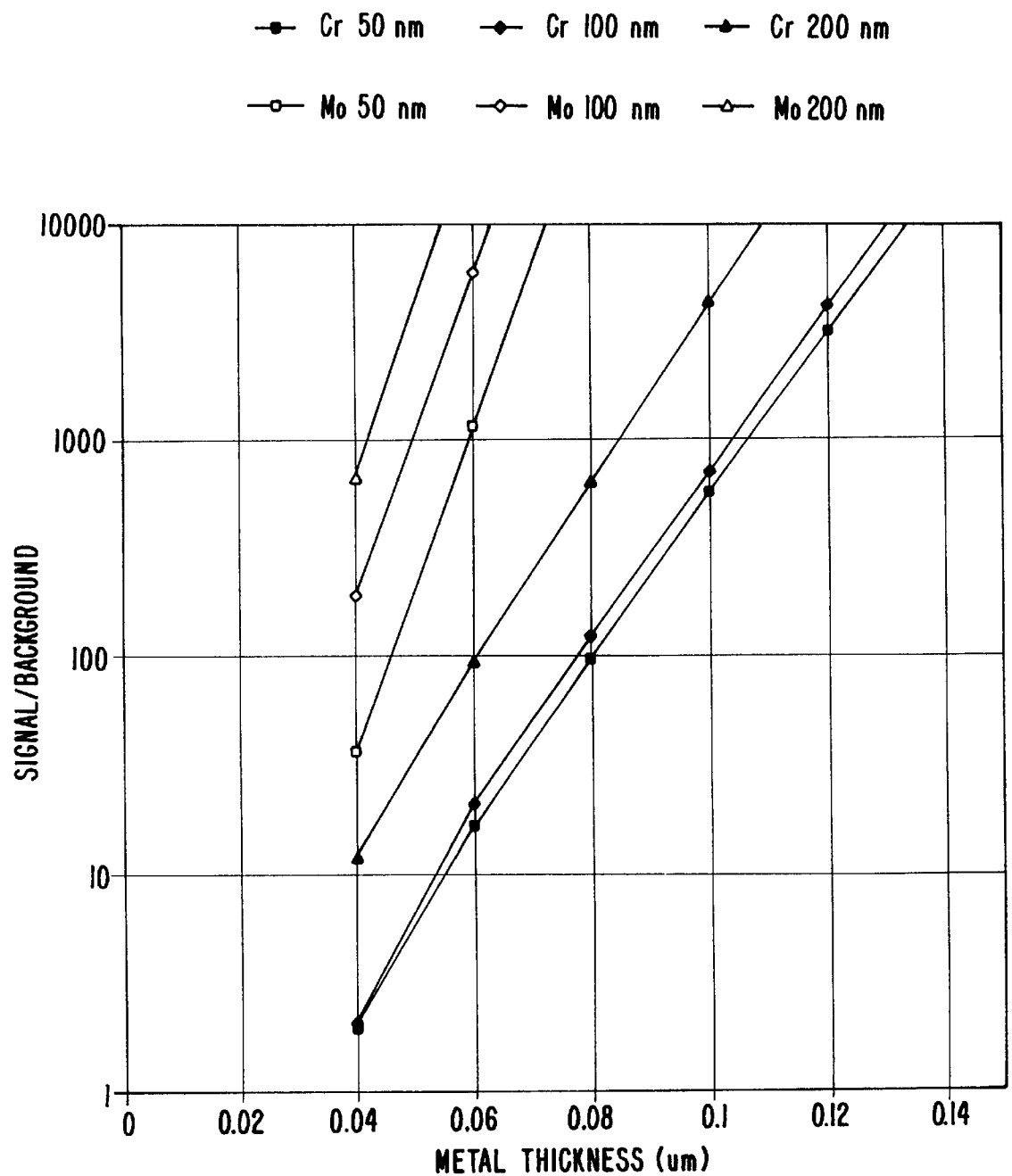
FIG. 9 shows the signal-to-background ratio versus film thickness for 50, 100, and 200 nm slit widths.

FIG. 9 shows the signal-to-background ratio (s/b) for a slit with vertical walls scanning a line pattern which is assumed to be as long as the slit, and with uniform illumination extending over a distance of 0.5 $\mu$m normal to the slit edge. In this case, the signal is the light going through the slit while the background is the light tunneling through the metal film. An acceptable s/b value is one in which the background has no significant effect on the measurements even when the slit is set near the edge of the image where the illumination is reduced. Furthermore there may be several line images or patterns illuminating the metal film for a single slit, so the results in FIG. 9 may represent an underestimate of the background by as much as a factor of 10. Therefore a reasonable value for s/b may be in excess of $10_4$. The required minimum thicknesses of the films are then about 60 to 70 nm for Mo and about 120 to 130 nm for Cr.

The incident polarization can always be decomposed into components of Transverse Magnetic mode (TM-magnetic vector parallel to the sides of the slit) and Transverse Electric mode (TE-electric vector parallel to the sides of the slit). Theoretically, at least one TM mode can always propagate through even a very narrow slit, i.e., it doesn't decay exponentially with the thickness of the slit material. This is an important advantage of the slit over a round aperture. Polarization effects are becoming important in lithography systems with high numerical aperture (NA) lenses, therefore an aerial image sensor which can measure polarization may be desirable. Furthermore, because the aerial image is measured in air rather than resist, the polarization effects are larger since the NA is reduced in the resist by its index of refraction.

Figure 10:
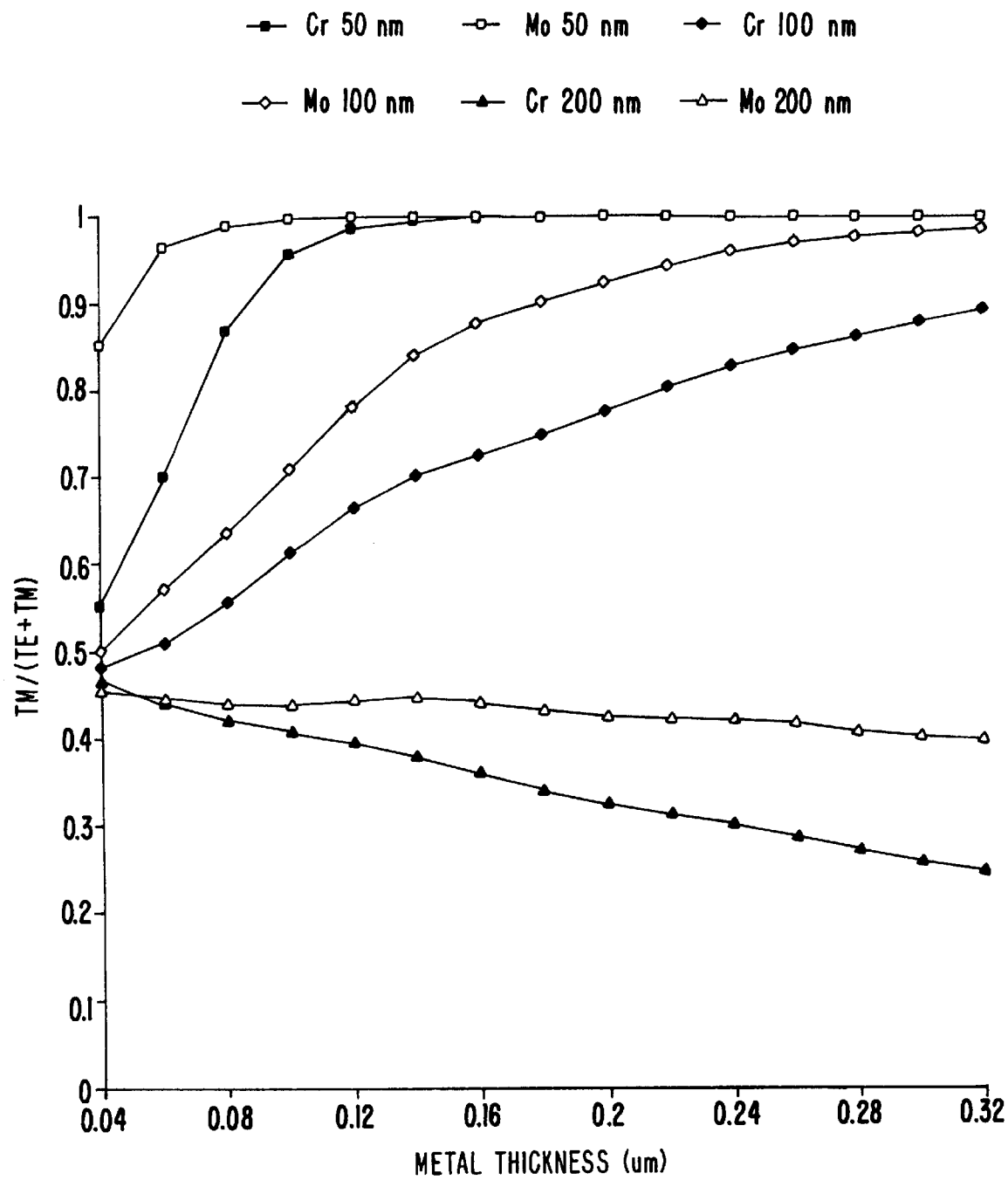
FIG. 10 shows the fraction of TM polarization in the transmitted signal for the vertical side wall case.

FIG. 10 shows the fraction of TM polarization in the transmitted signal for the vertical side wall slit case. For smaller width slits the polarization can be 100 percent TM for film thicknesses consistent with the S/B requirements shown in FIG. 9. Note that if a non-polarizing sensor were desired, a slit width between 100 and 200 nm would be required.

Figure 11:
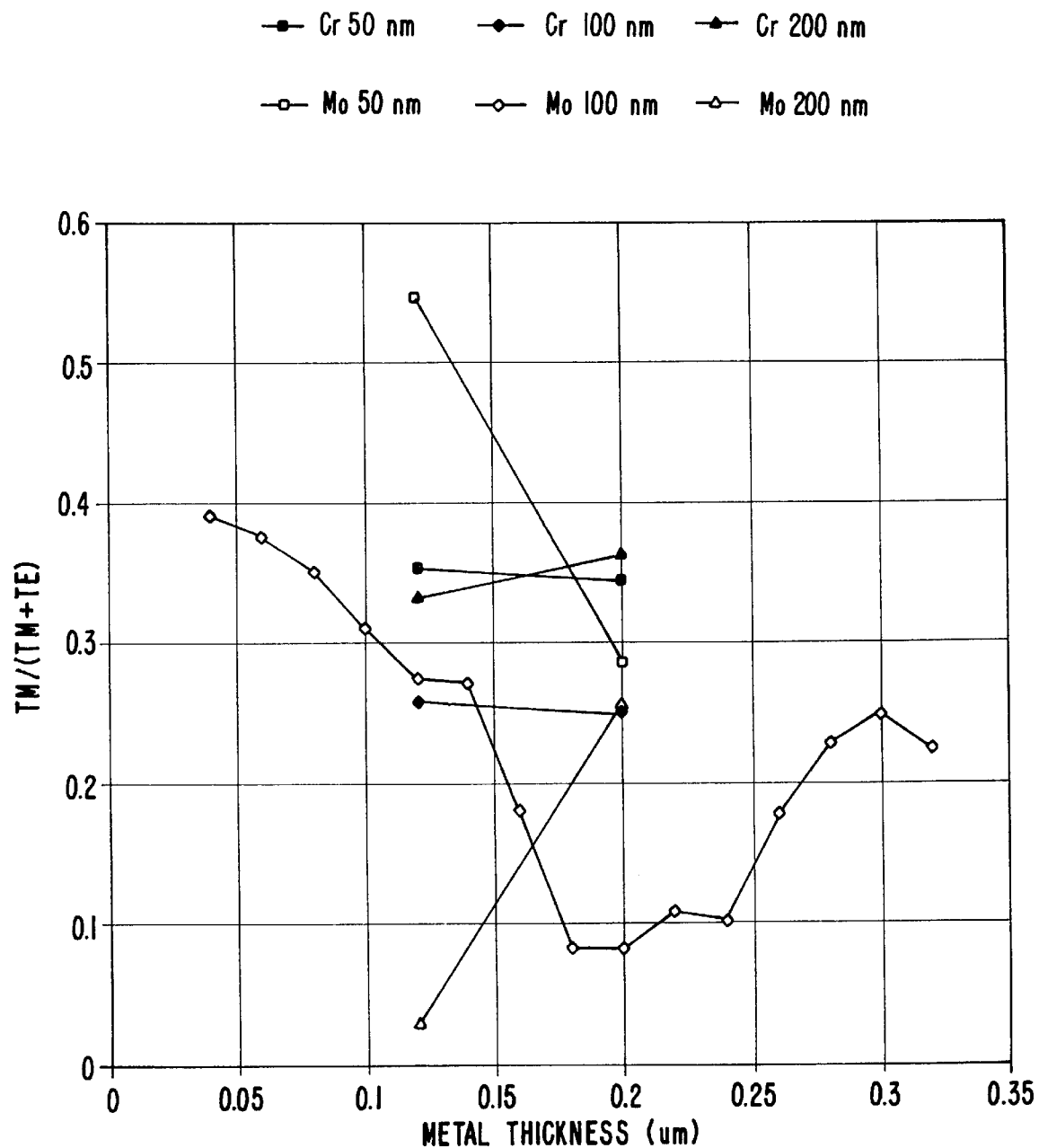
FIG. 11 shows the degree of TM polarization versus film thickness for the vee slit geometry.
Figure 12:
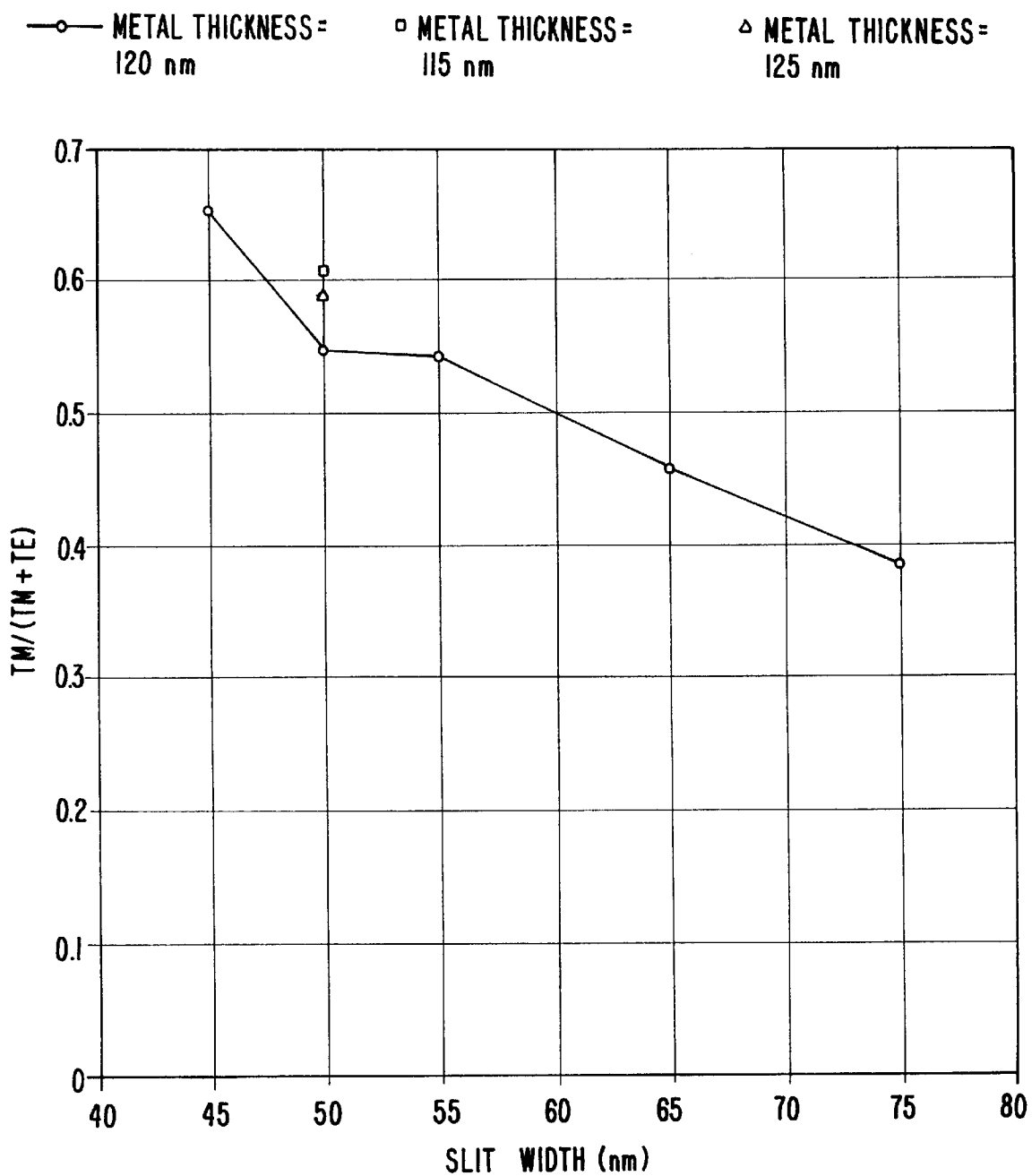
FIG. 12 shows the TM polarization versus slit width for the vee slit geometry.

FIGS. 11 and 12 show the result of calculations for the vee slit geometry. FIG. 11 shows the degree of TM polarization versus film thickness while FIG. 12 shows the TM polarization versus slit width for a Mo slit with the vee slit geometry. Very high degrees of TM polarization appear possible for this geometry. It also appears possible to get a TM polarization of 0.5 (corresponding to no polarization) for a slit width of about 60 nm and a metal thickness of 120 nm. The above analysis assumes normally incident waves. However, the results are little changed if light converging from a finite NA is used instead.

Figure 13:
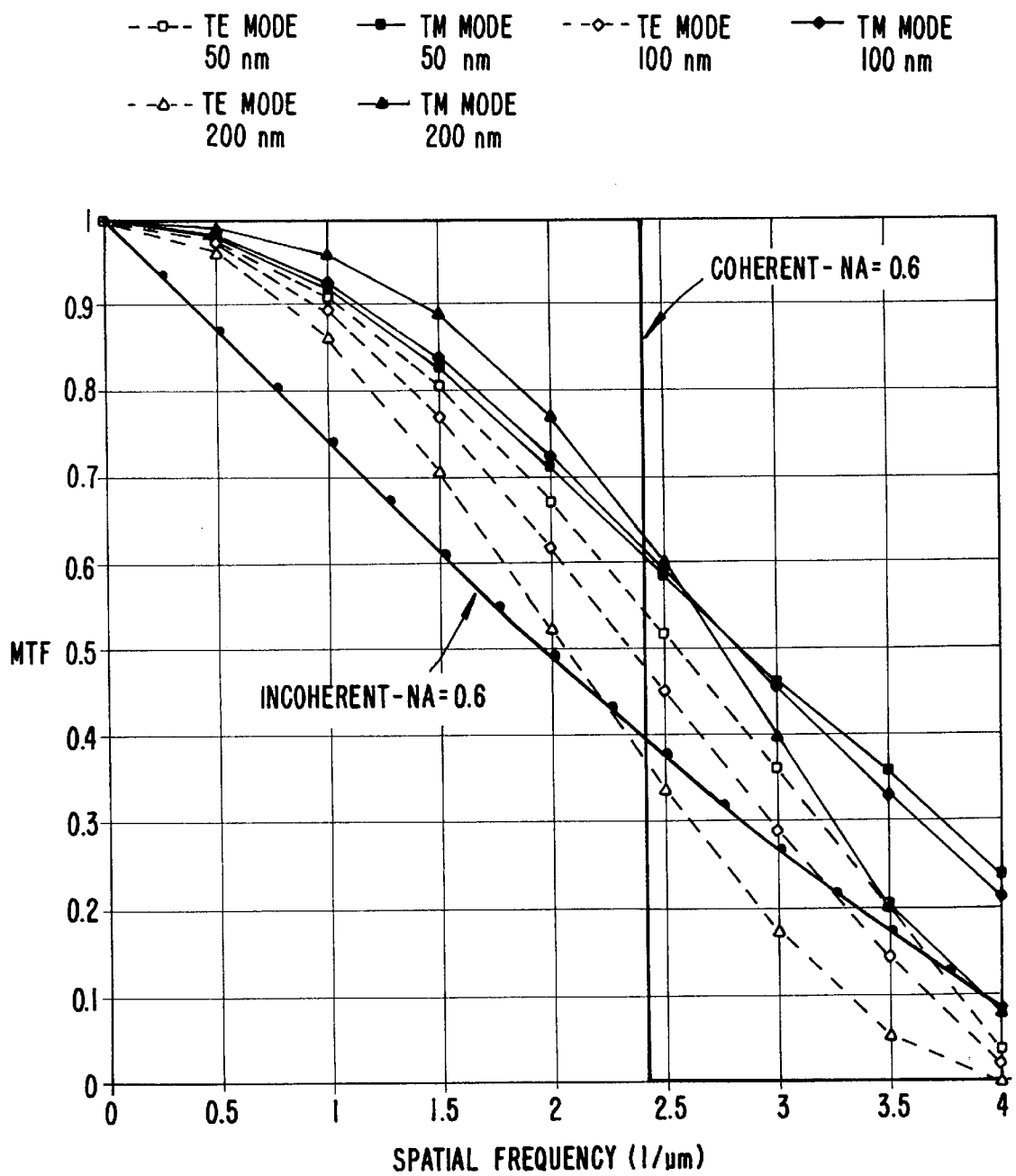
FIG. 13 shows the modulation transfer function (MTF) for a vee geometry slit with a Mo film thickness of 120 nm and slit widths of 50, 100, and 200 nm.

FIG. 13 shows the modulation transfer function (MTF) for a vee geometry slit with a Mo film thickness of 120 nm and various slit widths. The MTF definition for a slit is completely analogous to the normal definition of the MTF for a lens system in optics. The analysis is based on a normally incident plane wave and two other plane waves which are incident at angles ($\pm\theta$). The amplitude (to within a phase factor) at the surface of the film is $1+\cos(2\pi f_T x)$ where $f_T = \sin \theta/\lambda$ is the transverse spatial frequency. The transmitted signal from this illuminated sinusoidal grating is calculated for values of $2\pi f_T x=0$ and $2\pi f_T x=\pi$, at which the signal amplitudes are maximum (2) and minimum (0). This is equivalent to scanning the slit across the sinusoidal pattern. If the transmitted signal is $I(2\pi f_T x)$ the contrast C can be defined as $C=(I(0)-I(\pi))/(I(0)+I(\pi))$.

The value of C depends on $f_T$. For small values of $f_T$, i.e., very long transverse periods, the slit will follow the intensity variation very closely and the contrast will be _1. However, as $f_T$ increases, the contrast will drop. The maximum value of $f_T$ is $1/\lambda$ where $\lambda$ is the wavelength of the light. The slit must be at least less than $\lambda$ in order to pass all the spatial frequency components of the incident wave. For a coherent image produced by a lens with numerical aperture NA, the maximum spatial frequency is NA/$\lambda$. In addition the contrast for the components must be high enough that noise doesn't degrade the signal.

Since the MTF will in general depend on slit width, film thickness, and film composition, there is a considerable range of properties to be explored. Shown for comparison in the figure are the MTF's for an aberration free lens with an NA =0.6, illuminated by purely coherent or incoherent light. The slit MTF's extend to higher spatial frequencies than in the coherent case, and exceed the modulation level of the incoherent case. A line/space pattern illuminated with partially coherent light will lie between the coherent and incoherent lines. Therefore it is likely the slit will pass all the spatial frequencies of significance in the aerial image. However the higher frequency features will be reduced, because the slit MTF is less than 1.0. Therefore a correction process may be needed. For purely coherent or incoherent illumination the correction process can consist of Fourier transforming the scanned image, dividing the frequency spectrum by the slit MTF, and Fourier transforming back. For spatial frequencies where the projection lens MTF is small, this correction process does not have to be very accurate.

Figure 14:
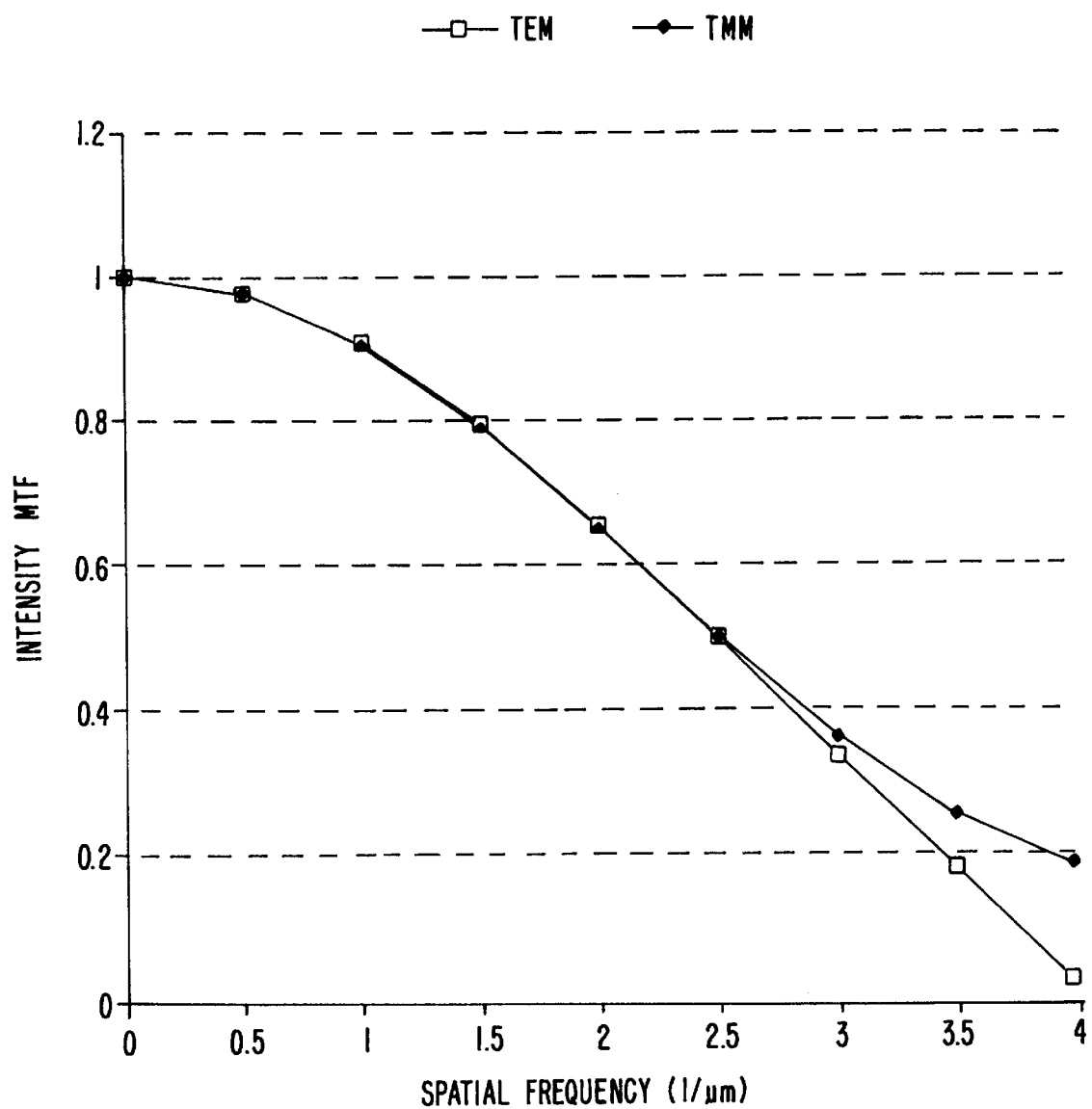
FIG. 14 shows conditions in which the TE and TM MTF's are almost the same.

FIG. 13 also shows that the MTF is different for TE and TM modes for this particular case. This is related to differences in transmission of the two modes described above. FIG. 14 shows a situation where the TE and TM MTF's are almost the same. For this example, a vee slit with a 65 nm slit width in Mo with a metal thickness of 120 nm is used (see FIG. 12). As will be seen below, a 150 nm vertical wall slit will have the MTF's approximately the same for TE and TM modes, and thus create no polarization effects.

The fact that the slit behavior is sensitive to polarization for narrower slit widths suggests that there is a trade-off between resolution and polarization insensitivity. Polarization sensitivity is no problem, however, if its effects can be measured. This can be done by measuring the aerial image sequentially with two slits with different polarization dependencies. The TE and TM images can then be determined. These slits may not have the same MTF, but as long as it is possible to correct for the effects of an MTF which is less than 1, there should not be a problem.

First consider the case where the polarization dependence is approximately independent of the spatial frequency composition of the image. Then the image is scanned with slits 1 and 2, the scanned intensities $I_1(x) \equiv I_1$ and $I_2(x) \equiv I_2$ can be written in terms of the TM and TE polarization components of the aerial image as $$I_1 = \epsilon_{TE}^1 I_{TE} + \epsilon_{TM}^1 I_{TM}$$
$$I_2 = \epsilon_{TE}^2 I_{TE} + \epsilon_{TM}^2 I_{TM}$$

where $\epsilon_{TE}^1$, $\epsilon_{TM}^1$, $\epsilon_{TE}^2$, and $\epsilon_{TM}^2$ are the polarization dependent transmissions for slits 1 and 2. The intensities for the two polarization states $I_{TE}$ and $I_{TM}$ are obtained by solving the above two equations for them.

When the polarization dependence varies with the spatial frequency f the derivation is as follows for the case of coherent illumination. The Fourier transforms of the measured intensities, $I_1(f)$ and $I_2(f)$, can be written in terms of the TE and TM components of the frequency spectra of the aerial image and the MTF's for the two polarization components of the two slits:

$$I_1(f) = MTF_{TE}^1(f) I_{TE}(f) + MTF_{TM}^1(f) I_{TM}(f)$$
$$I_2(f) = MTF_{TE}^2(f) I_{TE}(f) + MTF_{TM}^2(f) I_{TM}(f).$$

Solving for $I_{TE}(f)$ and $I_{TM}(f)$, and taking the Fourier transform yields the aerial images for the two polarization states $I_{TE}(X)$ and $I_{TM}(x)$. Some error may be introduced by these operations. However, if the spatial frequency dependencies of the two polarization states are not too different, the error will be small.

For the case of partial coherence, the MTF cannot be defined in general. However, for a specific pattern, such as the line patterns described above, a quantity which behaves like the MTF can be defined. Thus, relations similar to the above equations can be written, and these equations can then be solved for $I_{TE}$ and $I_{TM}$.

Figure 15:
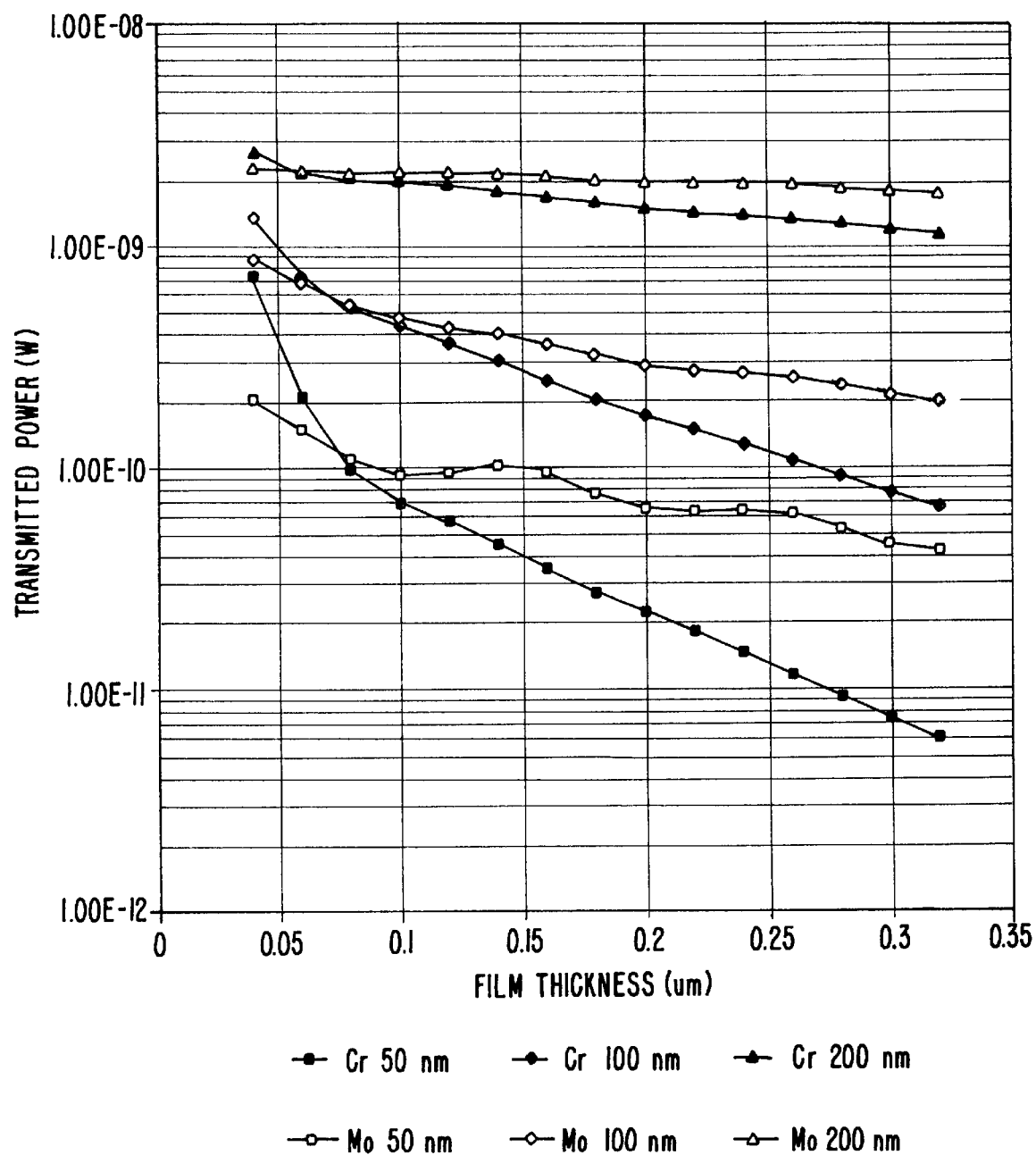
FIG. 15 shows the transmitted power from a slit, assuming a slit length of 10 $\mu$m and an illumination intensity of 100 mW per square centimeter.

FIG. 15 shows the transmitted power from a slit, assuming a slit length of 10 μm and an illumination intensity of 100 mW per square centimeter. The signal levels are approximately $10^{-10}$ to $10^{-9}$ watts.

Figure 16:
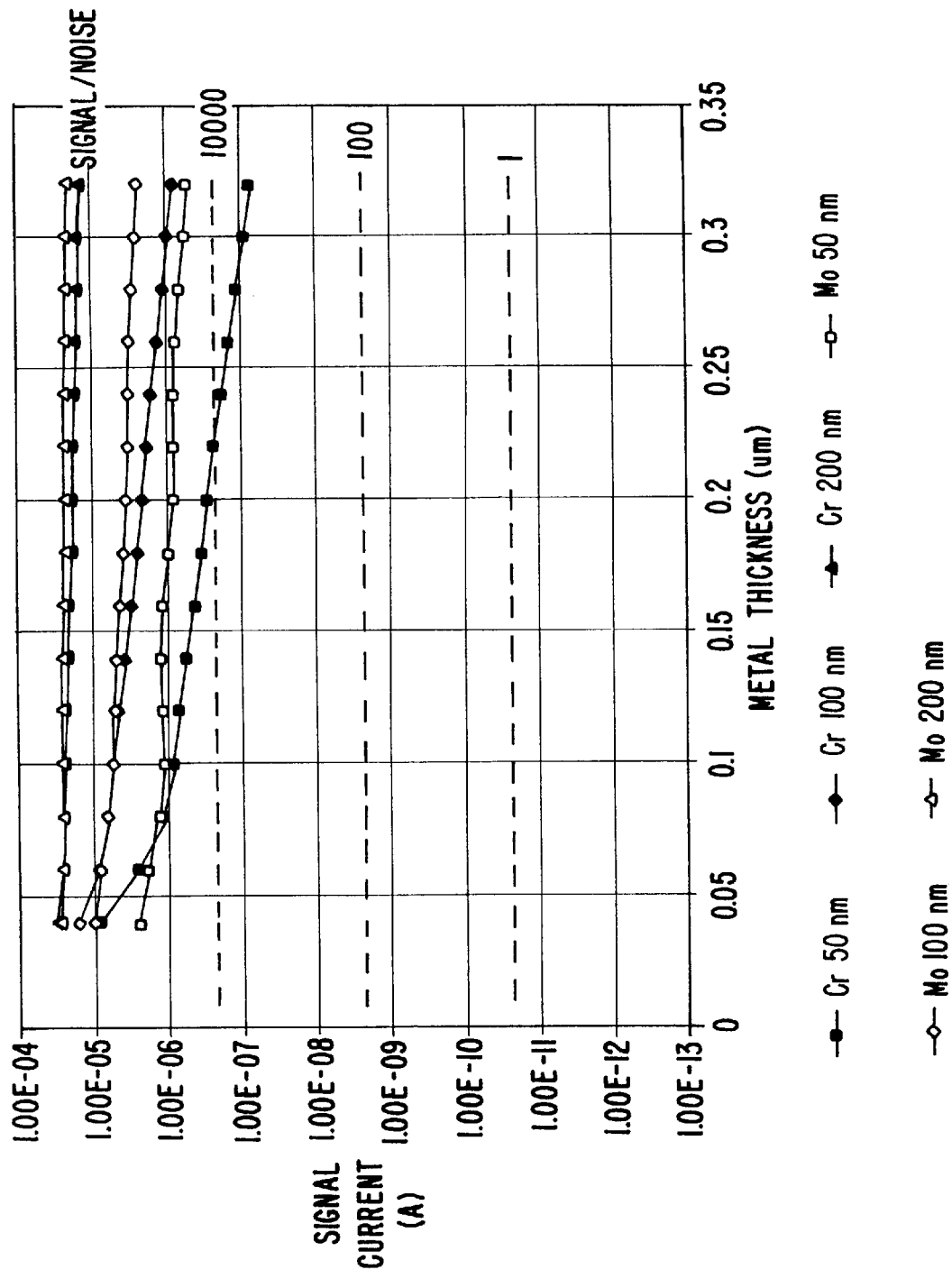
FIG. 16 shows the calculated signal-to-noise ratio (S/N)

FIG. 16 gives the calculated signal-to-noise ratio (S/N) based on a number of assumptions. A collection efficiency of 30 percent was used. A detector response to 248 nm photons was used. A photomultiplier with a quantum efficiency of 20 percent and a gain of $10^6$ followed by a preamplifier with an input noise factor of $2.2 \times 10^{-11}$ amps for a frequency bandwidth of 1000 hertz and at a sensitivity of 100 nanoamps per volt was assumed. Very high values of S/N are possible with the slits.

Tunneling Slit and Dot Structures

Figure 17:
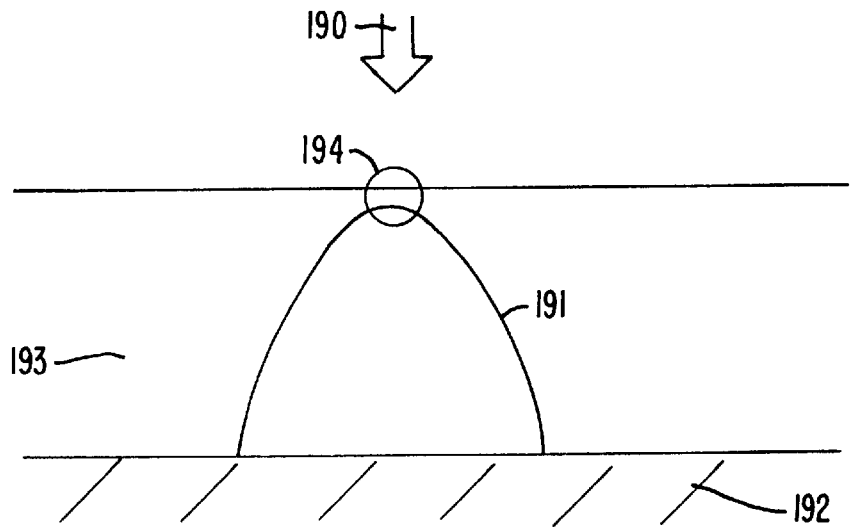
FIG. 17 shows the tunneling slit.

FIG. 17 illustrates a tunneling slit structure according to one aspect of the present invention. Light is incident on the top surface from a direction 190. A ridge-like optically transparent structure 191 is mounted on the surface of the fluorescent detector 192. Note that in this embodiment substrate 192 is actually serving two functions: first, as a substrate onto which the ridge is mounted and second, as an integral part of the detector. Alternatively the fluorescent detector may simply be a light pipe which transmits 248 nm photons to a deep ultraviolet sensitive detector like a photomultiplier. In an alternative embodiment, the ridge-like structure can be made of a fluorescent material.

The structure is covered by a planar metal film 193, such that only a very thin layer of metal 194 covers the highest part of the ridge. This makes it possible for light to tunnel through the thinnest parts of the film. Because the tunneling decreases exponentially with the thickness of the metal, the transmission is limited to the very thinnest layers. Therefore, it is possible to achieve high resolution with this device without having to create structures as narrow as the desired resolution.

Figure 18A:
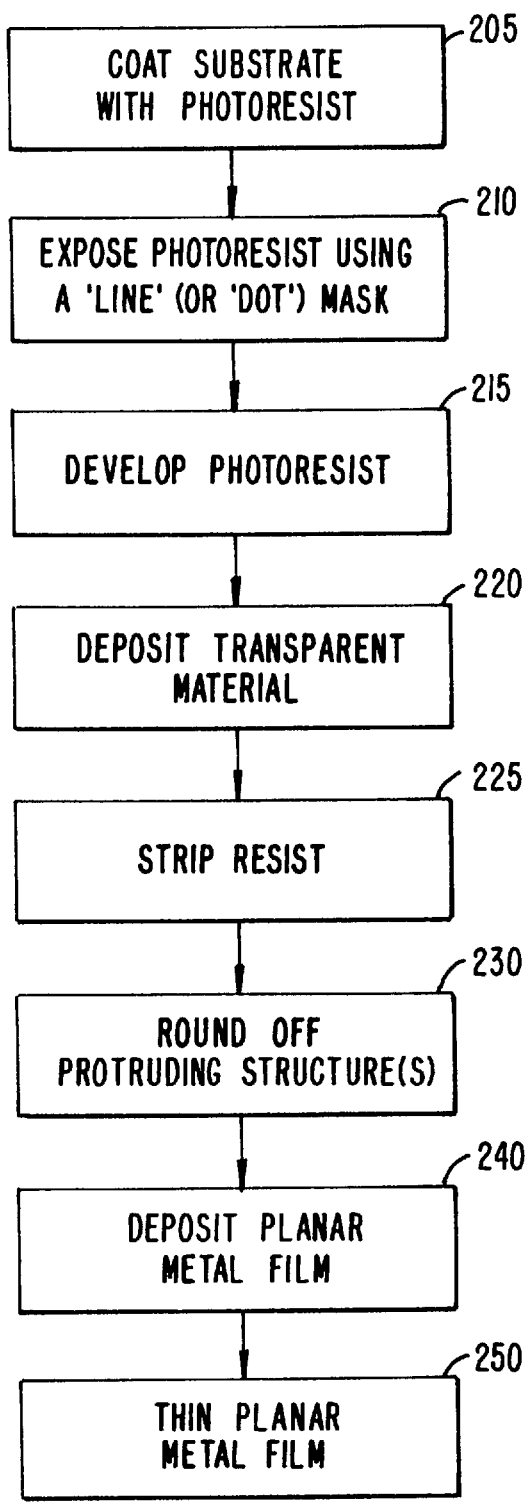
FIG. 18A, 18B, and 18C show the preferred fabrication techniques for the tunneling slit.
Figure 18B:
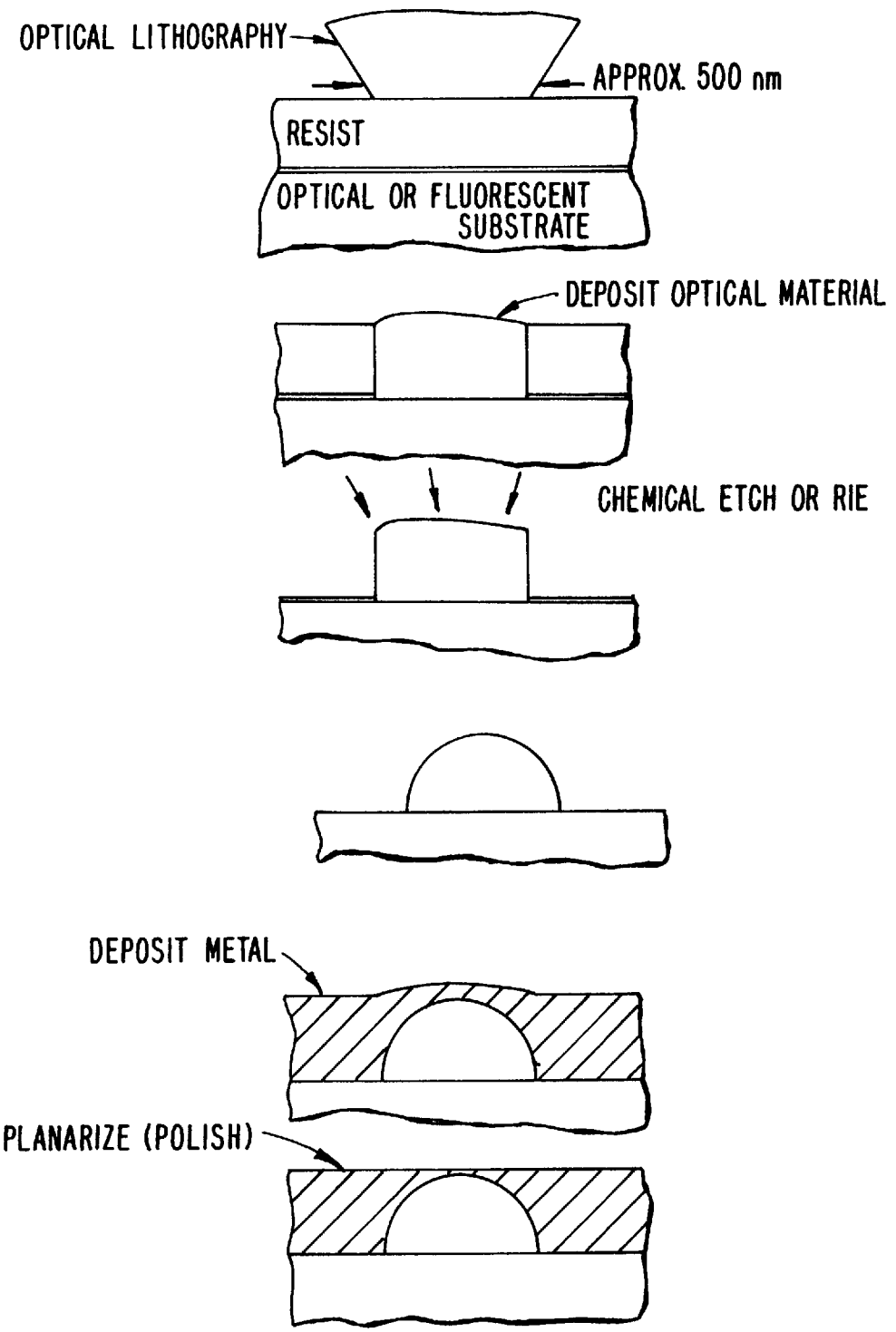

FIG. 18A is a flow diagram of the preferred fabrication technique for the tunneling slit. FIG. 18B shows pictorially the results at various stages of the fabrication. While the drawing shows a single tunneling slit, the technique is typically carried out to produce a plurality of tunneling slits. The slits can be spaced by a desired spacing to provide a multiple-slit structure along the lines of those shown in FIGS. 3A and 3B, or can be spaced farther apart to allow several single-slit structures to be fabricated.

First, a substrate is coated with a relatively thick layer of positive photoresist (step 205). Using conventional lithography techniques, the photoresist is exposed through a reticle which projects a narrow line, or lines, typically less than or equal to about 1 μm wide (typically approximately 0.5 μm wide) and 5 μm or more in length (typically 10 to 20 μm long) (step 210). A trench-like structure is left in the resist coated substrate after developing the photoresist (step 215). Next, an optically transparent material is deposited on the substrate thereby filling the trench (step 220). Once the resist is stripped away (step 225), the substrate is left with the deposited dielectric ridge. A number of different techniques can be used to round off the ridge (step 230) including thermal annealing, reactive ion etching, and chemical etching. After the ridge has been properly shaped, a metal film is deposited (step 240). The metal film is subsequently planarized and thinned, preferably using an etching technique, until the metal thickness measured at the highest portion of the ridge is much less than the applicable design wavelength (step 250).

Figure 18C:
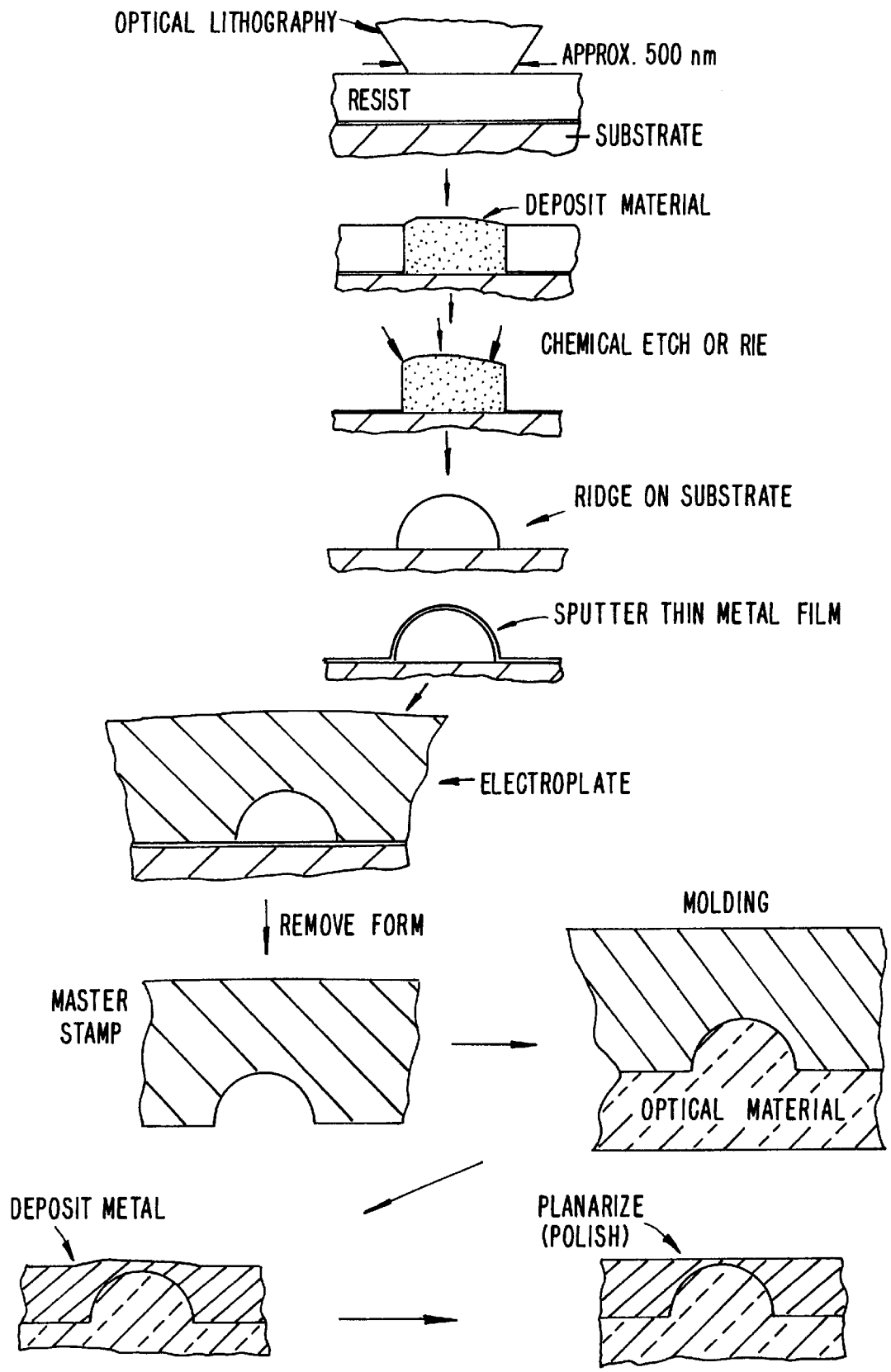

FIG. 18C shows pictorially the results at various stages according to an alternative fabrication technique, which is capable of providing further simplification in fabrication. FIG. 18C illustrates the following description. Using semiconductor processing techniques similar to those described above in FIG. 18B (i.e., steps 205–230), an array of the ridges is constructed on a substrate. In this case the material need not be optically transparent. A very thin layer of silver is sputtered on, and then a thick layer of nickel is applied by immersion in a nickel bath. The thick metal film is then separated from the substrate and ridge structure. This metal film can then serve as a "master" to make additional tunneling slit structures, by compression molding, injection molding, or photo polymerization. It is possible to mold glass as well as plastics. The result is an array of transparent ridges integrally formed on a transparent substrate.

Thereafter, a metal film is deposited and planarized as described above (i.e., steps 240 and 250). The process of molding the ridges is essentially identical to that used in making optical compact disks. The features on these disks are submicron in depth and size; thus it is likely this process can be used, and could reduce the cost of the tunneling slits significantly.

It should be mentioned that the basic properties and fabrication techniques described above could also be applied to a structure with submicron dimensions in every lateral direction. Such a structure could be called a "tunneling dot" and would be expected to have properties similar to a submicron round aperture. Although its transmission would probably be quite small, its relative simplicity and ease of fabrication may give it advantages in applications requiring a "point" detector or light source. In fact, FIGS. 18A, 18B, and 18C can be considered to show the manufacture of the tunneling dot as well as the tunneling slit.

Figure 20A:
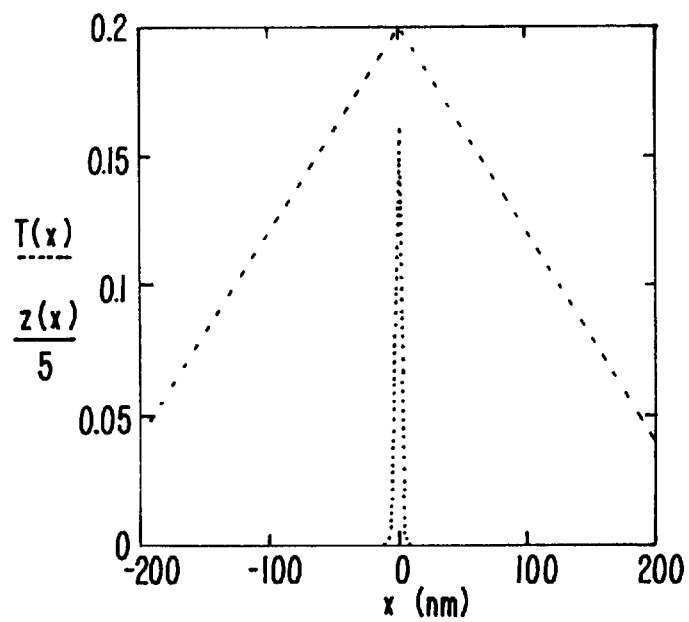
FIG. 20A shows the calculated transmission through a triangular (or "inverted vee") tunneling slit.
Figure 20B:
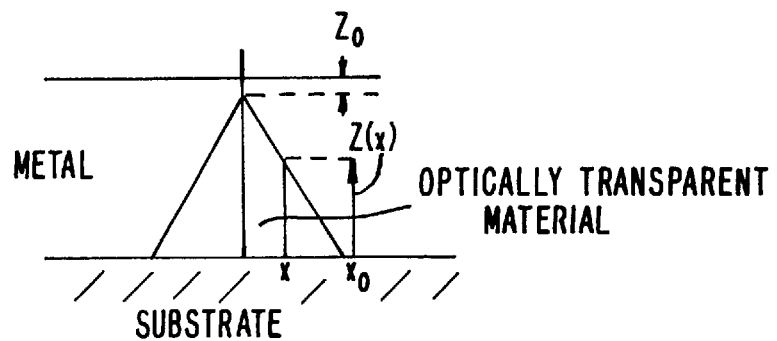
FIG. 20B shows the dimensional variables used in FIG. 20A.
Figure 19A:
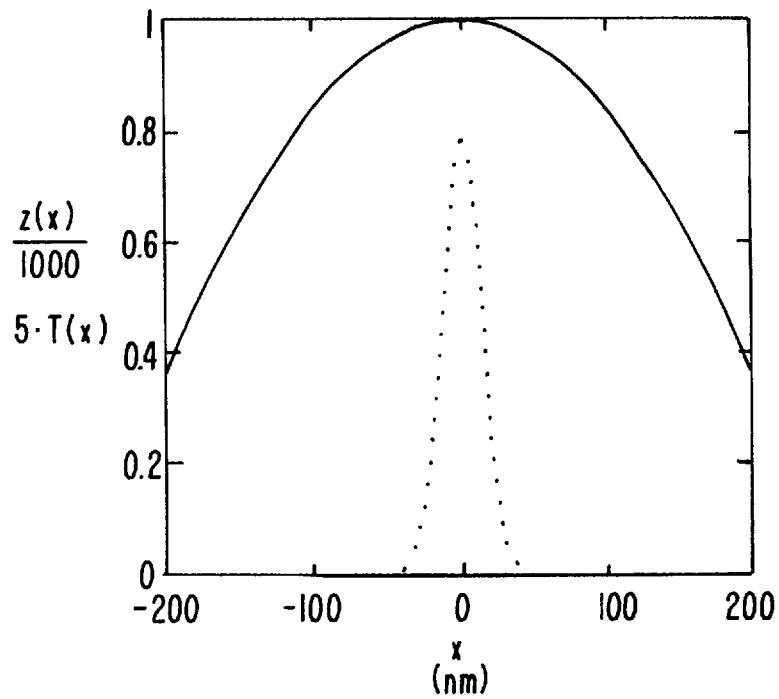
FIG. 19A shows the calculated transmission through a parabolic tunneling slit.
Figure 19B:
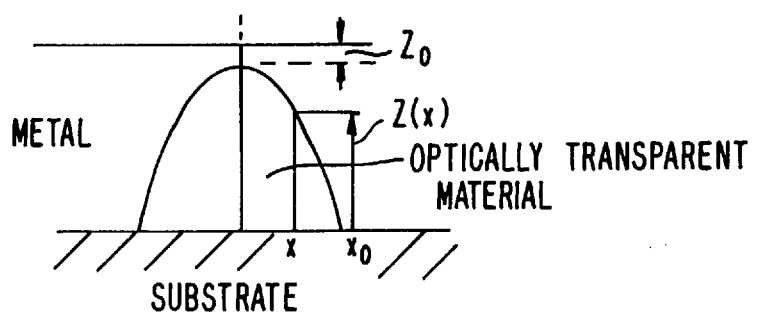
FIG. 19B shows the dimensional variables used in FIG. 19A.

FIG. 19A is the calculated transmission T(x) through a tunneling slit of parabolic cross section in which the parabolic shape is 0.5 μm wide and 1 μm high. The transmission of this structure is roughly equivalent to a slit whose full width is less than 50 nm. The shape of the tunneling slit z(x) is superimposed on this plot, the dimensional variables used being defined in FIG. 19B. FIG. 20A is the calculated transmission through a tunneling slit of triangular cross section in which the width and height of the triangular cross section is the same as that of the above parabolic cross section (tunneling slit shape superimposed on FIG. 20A). In this case the tunneling slit has a transmission profile less than 10 nm wide. The dimensional variables are defined in FIG. 20B. The transmission depends on the thickness $z_0$ of the thinnest layer of metal. This thickness, although affecting overall transmission, does not affect lateral resolution. These data show it is possible to fabricate very high resolution tunneling slits using conventional lithography. Equivalent resolution in a conventional slit would require an extremely narrow slit width, which may be more difficult to fabricate. These calculations are based on a simple ray optics model which ignores the effects of diffraction. However, the basic properties are confirmed by rigorous calculations based on the analytical wave guide model.

Figure 21:
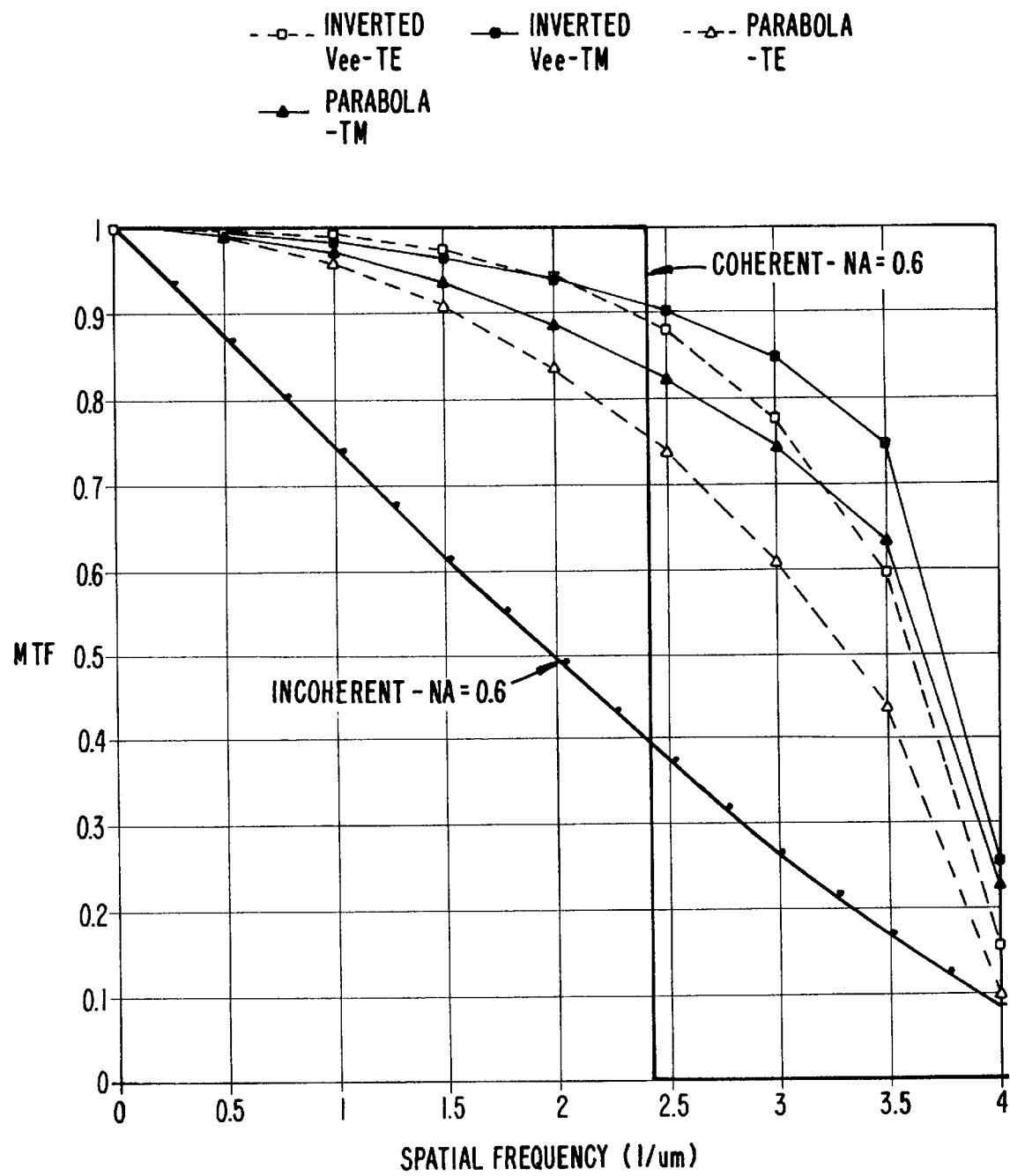
FIG. 21 shows the MTF's for tunneling slits.

FIG. 21 shows the MTF's for tunneling slits. Their response at high spatial frequencies are excellent, much higher than for normal slits.

The transmission through the parabolic tunneling slit is calculated to be $7.96 \times 10^{-4}$ for the TE mode and $1.34 \times 10^{-4}$ for the TM mode. These values are smaller than those shown earlier for the conventional slits. However, given the decrease in transmission for narrower slits shown in FIG. 5, a conventional slit narrow enough to match the MTF of the tunneling slit would probably have a comparable transmission. Note the TE mode transmission exceeds that of the TM mode; this is opposite to the behavior of the conventional slits.

Aerial Image Performance

Table 1 below summarizes simulations of the response of a slit to the aerial image for given conditions of illumination and projection lens characteristics. The results below were all calculated under the conditions of NA=0.6 and σ=0.5 at a wavelength of 248 nm. σ is the coherence factor:

σ=(NA at the reticle)/(NA at the wafer). The lens was assumed to be aberration-free. The slit image is proportioned to the square of the forward component of the Poynting vector ExB where E and B are the electric and magnetic fields respectively of the image. However, the aerial image is represented by the square of the electric field vector $E^2$, since photoresist exposure is determined more by $E^2$ than by ExB. This introduces some inconsistency in comparing the slit and aerial images, because the images created by these two representations are not identical, as shown below.

Results are given for tunneling slits with parabolic and triangular shapes, for a 120 nm thick Mo metal film with 50, 100, 150, 200 nm vertical wall slits, and for a 50 nm vee slit. From the MTF curves one might have expected good agreement between aerial and slit images for the narrower slits and the tunneling slits; however, this is not the case. The reason is that given above: the aerial image intensity $E^2$ is different than that for ExB. One result is that the slit image is frequently narrower than the aerial image represented by $E^2$, an initially surprising result.

In the table, $W_{slit}$ denotes the slit image width (ExB), $W_{A,E^2}$ denotes the aerial image width ($E^2$), and $W_{A,ExB}$ denotes the aerial image width (ExB).

TABLE 1

| Slit Geometry | TEM | TMM |
|---|---|---|
| 1. Triangular tunneling slit | $W_{slit} = W_{A,ExB} \approx W_{A,E^2}$ | $W_{slit} = W_{A,ExB} < W_{A,E^2}$ |
| 2. Parabolic tunneling slit | $W_{slit} \approx W_{A,E^2} \approx W_{A,ExB}$ | $W_{slit} \approx W_{A,ExB} < W_{A,E^2}$ |
| 3. 50 nm vertical wall slit | $W_{slit} \approx W_{A,E^2} \approx W_{A,ExB}$ | $W_{slit} \approx W_{A,ExB} < W_{A,E^2}$ |
| 4. 100 nm vertical wall slit | $W_{slit} \approx W_{A,E^2} \approx W_{A,ExB}$ | $W_{slit} \approx W_{A,ExB} < W_{A,E^2}$ |
| 5. 150 nm vertical wall slit | $W_{slit} \approx W_{A,E^2} \approx W_{A,ExB}$ | $W_{slit} \approx W_{A,E^2} > W_{A,ExB}$ |
| 6. 200 nm vertical wall slit | $W_{slit} > W_{A,E^2} \approx W_{A,ExB}$ | $W_{slit} > W_{A,E^2} > W_{A,ExB}$ |
| 7. 50 nm "vee" slit | $W_{slit} > W_{A,E^2} \approx W_{A,ExB}$ | $W_{slit} \approx W_{A,E^2} > W_{A,ExB}$ |

In the first four cases, the slit has adequate resolution to reproduce the aerial image (ExB). In the TEM case it also reproduces approximately the $E^2$ image in the first five cases. In the TMM case, the $E^2$ aerial image is less than the ExB image for the narrower slits, but it becomes larger for cases 5, 6 and 7. Thus, somewhere between vertical wall slit widths of 100 nm and 150 nm, we may expect $W_{slit}=W_{A,E^2}$. The 50 nm vee slit is somewhat similar to the 200 nm vertical wall slit case, because of tunneling through the thinner parts of the slit structure.

A study of the data which produced Table 1 shows that a vertical wall slit of width 150 nm represents a close to ideal detector, with little polarization dependence, and agreement between aerial image width and measured image width to within 5%.

Other Applications of the Tunneling Slit or Dot

The expected ease of fabrication and the very high MTF of the tunneling slit suggest other applications as well. The one-dimensional slit geometry is suitable for measuring microscopes designed to measure distances very accurately in a given direction. An example is a system to measure line widths very precisely on lithographic masks or semiconductor wafers. It may also have application as a detection sensor on a high density optical disk or magnetooptical disk.

Another class of applications uses the tunneling slit as a very localized source of light for creating submicron patterns in thin layers of photoresist. In this case light is provided on the substrate side of the tunneling slit, and some fraction of the light tunnels through where the metal film is thinnest. A film of photoresist placed very close to the slit surface will be exposed primarily over an area comparable to the region where tunneling through the metal film is appreciable. Thus exposure of submicron patterns should be possible. While the transmission of light through the tunneling slit may be expected to be small, the simplicity and potentially low cost of the tunneling slit may give it advantages over other photolithography techniques for some applications.

Conclusion

In conclusion it can be seen that the present invention provides an effective technique for analyzing the performance of an optical system by scanning a subwavelength slit over the aerial image formed by the system.

As will be understood by those familiar with the art, the present invention may be embodied in other specific forms without departing from the spirit or essential characteristics thereof. For example, the disclosed apparatus and method could be used to analyze the intensity profile of a laser scanning system. Accordingly, disclosure of the preferred embodiment of the invention is intended to be illustrative, but not limiting, of the scope of the invention which is set forth in the following claims.

What is claimed is:

1. A tunneling device for use at a wavelength R, comprising:

a substrate comprising a first surface and a second surface;

an optically transparent upstanding structure coupled to and extending nominally upwardly from said first surface of said substrate; and a metal film that covers said first surface of said substrate and said structure, said metal film having a thickness, measured at the highest portion of said structure, much less than the wavelength R.

2. The tunneling device of claim 1, wherein said structure is manufactured from optically transparent material.

3. The tunneling device of claim 1, wherein said structure is manufactured from fluorescent material.

4. The tunneling device of claim 1, wherein said substrate is a fluorescent detector.

5. The tunneling device of claim 1, wherein said substrate is a light pipe.

6. The tunneling device of claim 1 wherein said structure is an elongate ridge so that the device is a tunneling slit.

7. The tunneling device of claim 1 wherein said structure is a protuberance so that the device is a tunneling dot.

* * * * *